United States Patent
Sukachev et al.

(10) Patent No.: US 11,074,520 B2
(45) Date of Patent: Jul. 27, 2021

(54) EXTENDED COHERENCE AND SINGLE-SHOT READOUT OF A SILICON-VACANCY SPIN IN DIAMOND

(71) Applicant: President and Fellows of Harvard College, Cambridge, MA (US)

(72) Inventors: Denis D. Sukachev, Cambridge, MA (US); Alp Sipahigil, Cambridge, MA (US); Christian Thieu Nguyen, Cambridge, MA (US); Mihir Keshav Bhaskar, Cambridge, MA (US); Ruffin E. Evans, Somerville, MA (US); Mikhail D. Lukin, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 16/638,313

(22) PCT Filed: Aug. 10, 2018

(86) PCT No.: PCT/US2018/046287
§ 371 (c)(1),
(2) Date: Feb. 11, 2020

(87) PCT Pub. No.: WO2019/033009
PCT Pub. Date: Feb. 14, 2019

(65) Prior Publication Data
US 2020/0184362 A1    Jun. 11, 2020

Related U.S. Application Data

(60) Provisional application No. 62/544,254, filed on Aug. 11, 2017.

(51) Int. Cl.
*G06N 10/00* (2019.01)
*H04B 10/90* (2013.01)
(Continued)

(52) U.S. Cl.
CPC .............. *G06N 10/00* (2019.01); *G11C 11/16* (2013.01); *H04B 10/90* (2013.01); *B82Y 10/00* (2013.01)

(58) Field of Classification Search
CPC ........ G06N 10/00; G06N 20/00; H04B 10/90; B82Y 10/00; B82Y 30/00; H01L 29/1602; G11C 11/16
See application file for complete search history.

(56) References Cited

U.S. PATENT DOCUMENTS

| | | | |
|---|---|---|---|
| 9,335,606 B2 | 5/2016 | Hanson et al. | |
| 2016/0252715 A1* | 9/2016 | Nakano | G02B 21/16 |
| | | | 359/385 |
| 2017/0076787 A1 | 3/2017 | Frank | |

FOREIGN PATENT DOCUMENTS

WO    WO-2014/210486 A1    12/2014

OTHER PUBLICATIONS

Suter, D. and Álvarez, G.A., 2016. Colloquium: Protecting quantum information against environmental noise. Reviews of Modern Physics, 88(4), p. 041001.*

(Continued)

*Primary Examiner* — Zhitong Chen
(74) *Attorney, Agent, or Firm* — Wilmer Cutler Pickering Hale and Dorr LLP

(57) ABSTRACT

Systems and methods are disclosed for preparing and evolving atomic defects in diamond. Silicon vacancy spins may be cooled to temperatures equal to or below 500 mK to reduce the influence of phonons. The cooling, manipulation, and observation systems may be designed to minimize added heat into the system. A CPMG sequence may be applied to extend coherence times. Coherence times may be extended, for example, to 13 ms.

27 Claims, 13 Drawing Sheets

(51) Int. Cl.
B82Y 10/00 (2011.01)
G11C 11/16 (2006.01)

(56) References Cited

OTHER PUBLICATIONS

Rogers, Lachlan J., Kay D. Jahnke, Mathias H. Metsch, Alp Sipahigil, Jan M. Binder, Tokuyuki Teraji, Hitoshi Sumiya et al. "All-optical initialization, readout, and coherent preparation of single silicon-vacancy spins in diamond." Physical review letters 113, No. 26 (2014): 263602.*
Müller, T., C. Hepp, B. Pingault, E. Neu, S. Gsell, M. Schreck, H. Sternschulte, D. Steinmüller-Nethl, C. Becher, and M. Atatüre. "Optical signatures of silicon-vacancy spins in diamond Nat." (2014): 3328.*
Awschalom, David D., Lee C. Bassett, Andrew S. Dzurak, Evelyn L. Hu, and Jason R. Petta. "Quantum spintronics: engineering and manipulating atom-like spins in semiconductors." Science 339, No. 6124 (2013): 1174-1179.*
Sun, S. and Waks, E., 2016. Single-shot optical readout of a quantum bit using cavity quantum electrodynamics. Physical Review A, 94(1), p. 012307.*
Vinante, A., G. H. C. J. Wijts, O. Usenko, L. Schinkelshoek, and T. H. Oosterkamp. "Magnetic resonance force microscopy of paramagnetic electron spins at millikelvin temperatures." Nature communications 2, No. 1 (2011): 1-6.*
International Search Report and Written Opinion dated Oct. 22, 2018, in the International Application No. PCT/US18/46287. 16 pages.
Sukachev et al., "Silicon-Vacancy Spin Qubit in Diamond: A Quantum Memory Exceeding 10 ms with Single-Shot State Readout," Physical Review Letters, Nov. 29, 2017, vol. 119, 223602. 5 pages.
Balasubramanian et al., "Ultralong spin coherence time in isotopically engineered diamond," Nature Materials, May 2009, vol. 8, pp. 383-385.
Bar-Gill et al., "Solid-state electronic spin coherence time approaching one second," Nature Communications, Apr. 23, 2013, vol. 4, 1743, 6 pages.
Becker et al., "Ultrafast all-optical coherent control of single silicon vacancy colour centres in diamond," Nature Communications, Nov. 14, 2016, vol. 7:13512, 6 pages.
Childress et al., "Coherent Dynamics of Coupled Electron and Nuclear Spin Qubits in Diamond," Science, Oct. 13, 2006, vol. 314, pp. 281-285.
Childress et al., "Fault-Tolerant Quantum Communication Based on Solid-State Photon Emitters," Physical Review Letters, Feb. 23, 2006, vol. 96, 070504, 4 pages.
De Lange et al. "Universal dynamical decoupling of a single solid-state spin from a spin bath," Science, Oct. 2010, vol. 330, No. 60, 16 pages.
Delteil et al., "Generation of heralded entanglement between distant hole spins," Nature Physics, Mar. 2016, vol. 12, pp. 218-222.
Delteil et al., "Observation of Quantum Jumps of a Single Quantum Dot Spin Using Submicrosecond Single-Shot Optical Readout," Physical Review Letters, Mar. 19, 2014, vol. 112, 116802, 5 pages.
Edmonds et al., "Electron paramagnetic resonance studies of silicon-related defects in diamond," Physical Review B, Jun. 2008, vol. 77, 245205, 12 pages.
Evans et al., "Coherent optical emitters in diamond nanostructures via ion implantation," Physical Review Applied, vol. 5, 7 pages, available online Dec. 15, 2015.

Faraon et al. "Coupling of Nitrogen-Vacancy Centers to Photonic Crystal Cavities in Monocrystalline Diamond," Physical Review Letters, Jul. 19, 2012, vol. 109, 033604, 5 pages.
Gao et al., "Coherent manipulation, measurement and entanglement of individual solid-state spins using optical fields," Nature Photonics, Jun. 2015, vol. 9, pp. 363-373.
Hensen et al., "Loophole-free Bell inequality violation using electron spins separated by 1.3 kilometres," Nature, Oct. 29, 2015, vol. 526, pp. 682-686.
Hepp et al., "Electronic Structure of the Silicon Vacancy Color Center in Diamond," Physical Review Letters, Jan. 24, 2014, vol. 112, 036405, 5 pages.
Jahnke et al., "Electron-phonon processes of the silicon-vacancy centre in diamond," New Journal of Physics, Apr. 8, 2015, vol. 17, 043011, 12 pages.
Lodahl et al., "Interfacing single photons and single quantum dots with photonic nanostructures," Reviews of Modern Physics, Apr.-Jun. 2015, vol. 87, pp. 347-400.
Medford et al., "Scaling of Dynamical Decoupling for Spin Qubits," Physical Review Letters, Feb. 23, 2012, vol. 108, 086802, 5 pages.
Meiboom et al., "Modified Spin-Echo Method for Measuring Nuclear Relaxation Times," Review of Scientific Instruments, Aug. 1958, vol. 29, No. 8, pp. 688-691.
Neu et al., "Single photon emission from silicon-vacancy colour centres in chemical vapour deposition nano-diamonds on iridium," New Journal of Physics, Feb. 21, 2011, vol. 13, 025012, 21 pages.
Pingault et al., "All-Optical Formation of Coherent Dark States of Silicon-Vacancy Spins in Diamond," Physical Review Letters, Dec. 22, 2014, vol. 113, 263601, 5 pages.
Pingault et al., "Coherent control of the silicon-vacancy spin in diamond," Nature Communications, May 30, 2017, vol. 8, 15579, 7 pages.
Press et al., "Ultrafast optical spin echo in a single quantum dot," Nature Photonics, Jun. 2010, vol. 4, pp. 367-370.
Robledo et al., "High-fidelity projective read-out of a solid-state spin quantum register," Nature, Sep. 2011, vol. 477, pp. 574-578.
Rogers et al., "All-Optical Initialization, Readout, and Coherent Preparation of Single Silicon-Vacancy Spins in Diamond," Physical Review Letters, Dec. 22, 2014, vol. 113, 263602, 5 pages.
Rogers et al., "Multiple intrinsically identical single-photon emitters in the solid state," Nature Communications, Aug. 27, 2014, vol. 5, 4739, 6 pages.
Ryan et al., "Robust Decoupling Techniques to Extend Quantum Coherence in Diamond," Physical Review Letters, Nov. 12, 2010, vol. 105, 200402, 4 pages.
Shinada et al., "Deterministic doping to silicon and diamond materials for quantum processing," 2016 IEEE, 16th International Conference on Nanotechnology, Japan, Aug. 22-25, 2016, pp. 888-890.
Sigillito et al., "Fast, low-power manipulation of spin ensembles in superconducting microresonators," Applied Physics Letters, published online Jun. 5, 2014, vol. 104, 222407, 4 pages.
Sipahigil et al., "An integrated diamond nanophotonics platform for quantum-optical networks," Science, Nov. 18, 2016, vol. 354, issue 6314, pp. 847-850.
Sipahigil et al., "Indistinguishable Photons from Separated Silicon-Vacancy Centers in Diamond," Physical Review Letters, Sep. 11, 2014, vol. 113, 113602, 5 pages.
Yamamoto et al. "Extending spin coherence times of diamond qubits by high-temperature annealing," Physical Review B, Aug. 23, 2013, vol. 88, 075206, 8 page.

* cited by examiner

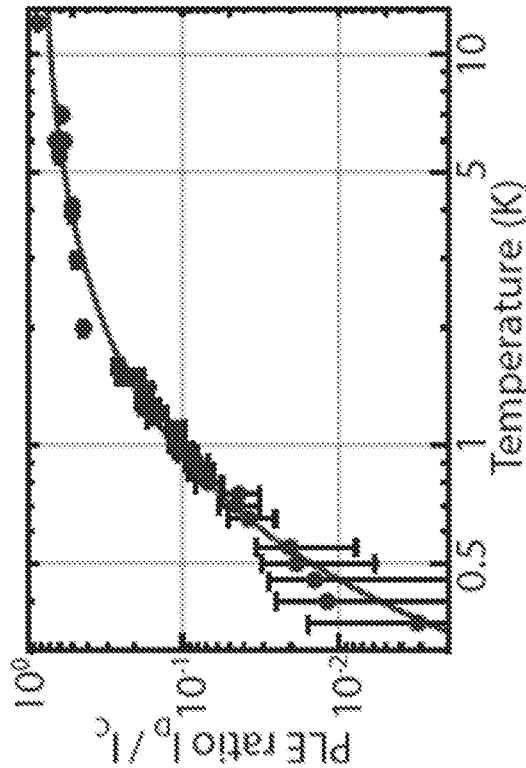
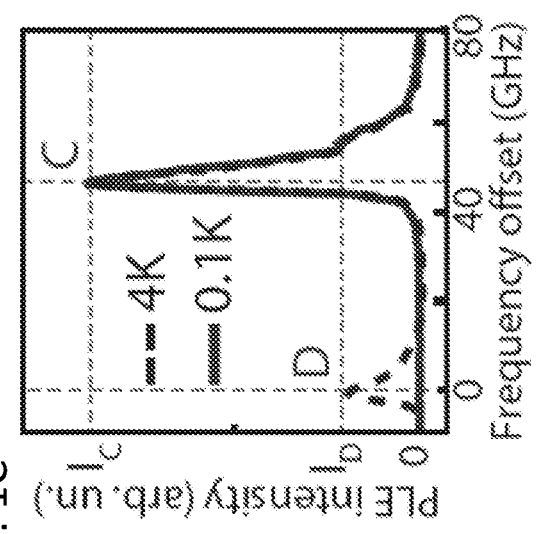
FIG. 1A FIG. 1B FIG. 1C FIG. 1D

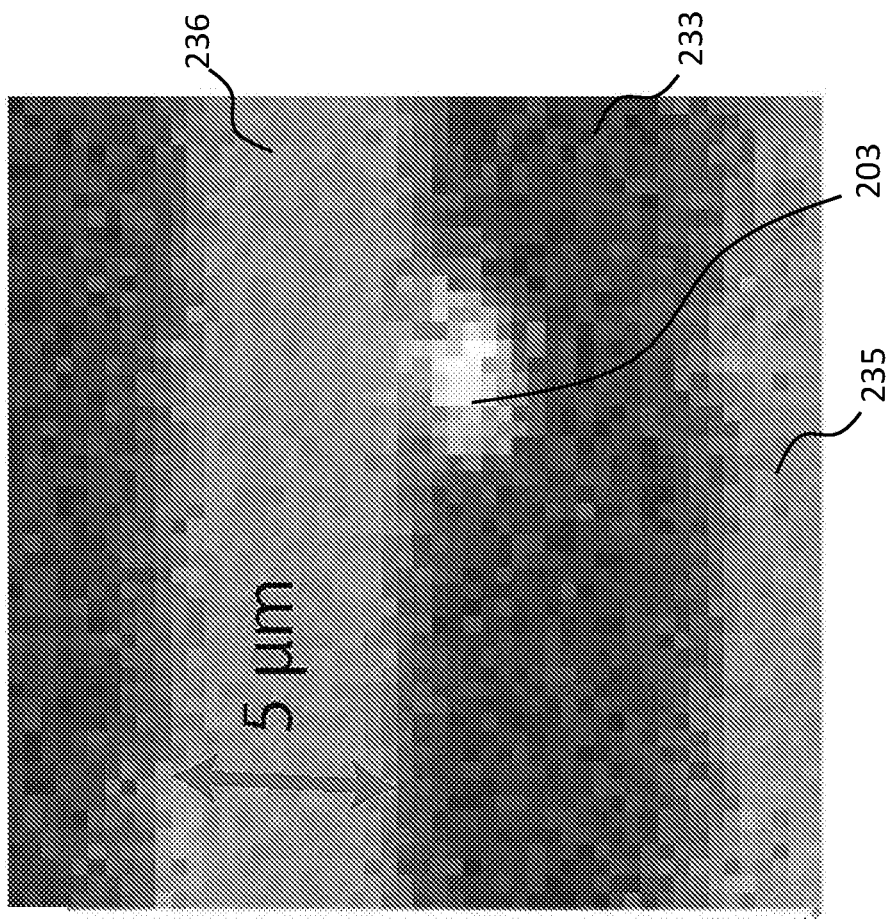
FIG. 1G
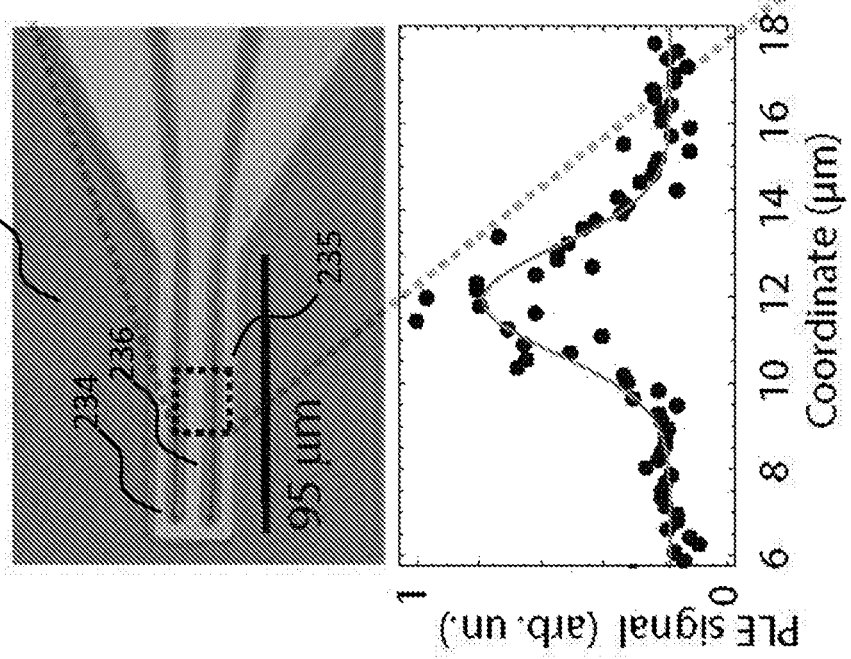
FIG. 1F
FIG. 1H

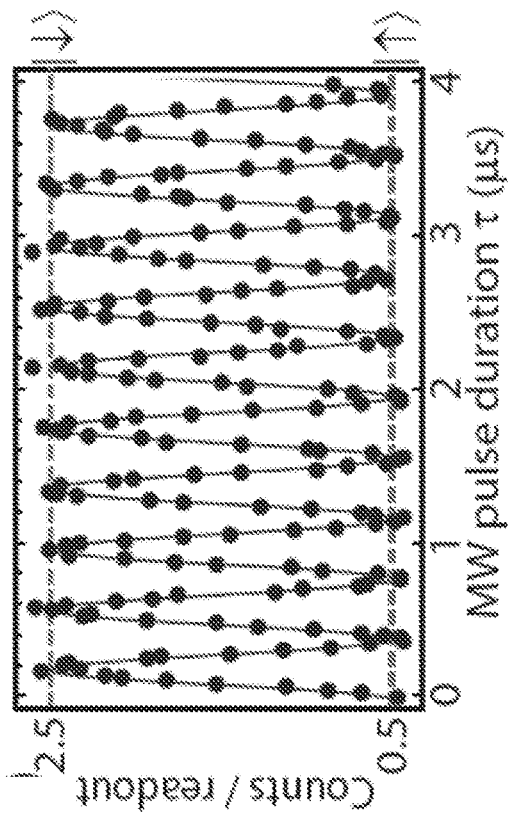
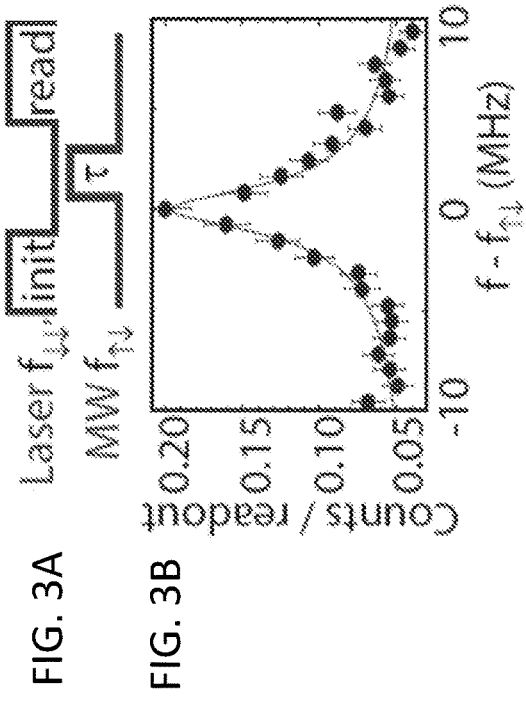
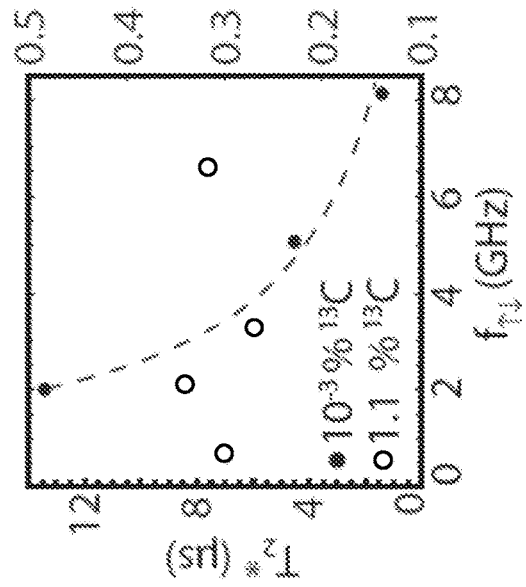
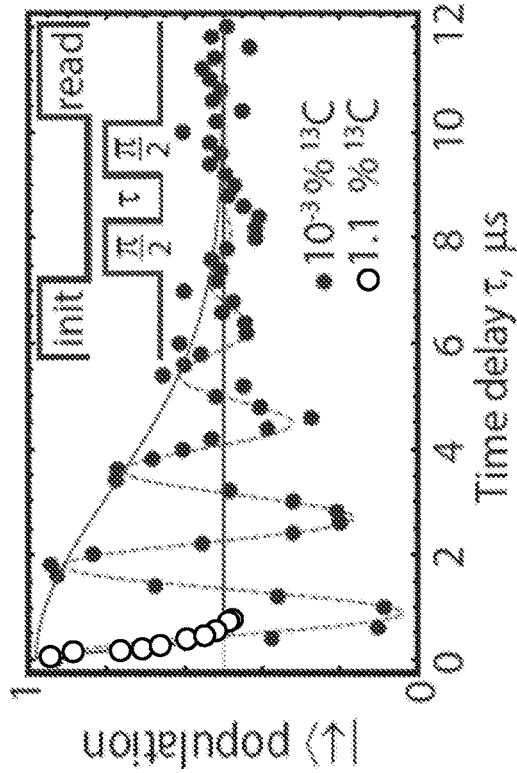
FIG. 3A
FIG. 3B
FIG. 3C
FIG. 3D
FIG. 3E

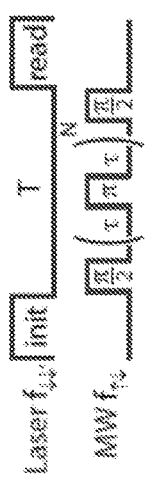
FIG. 4A
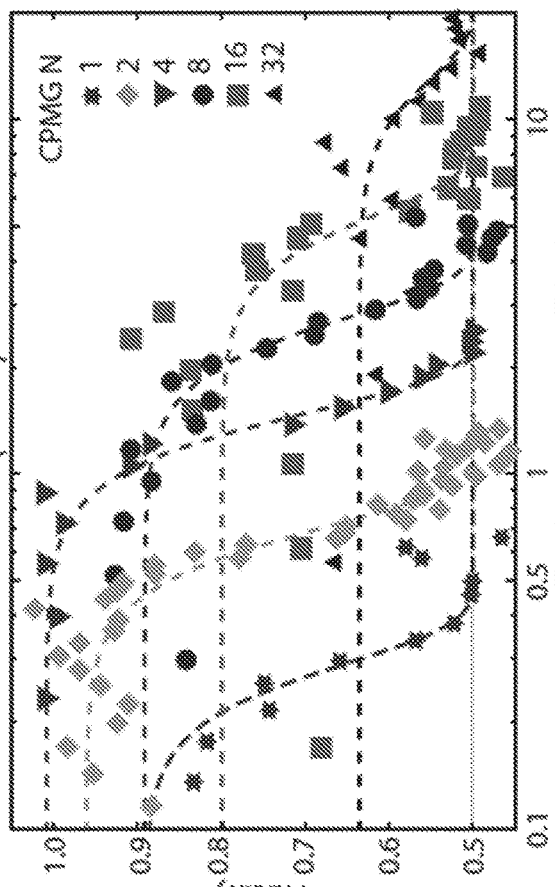
FIG. 4B
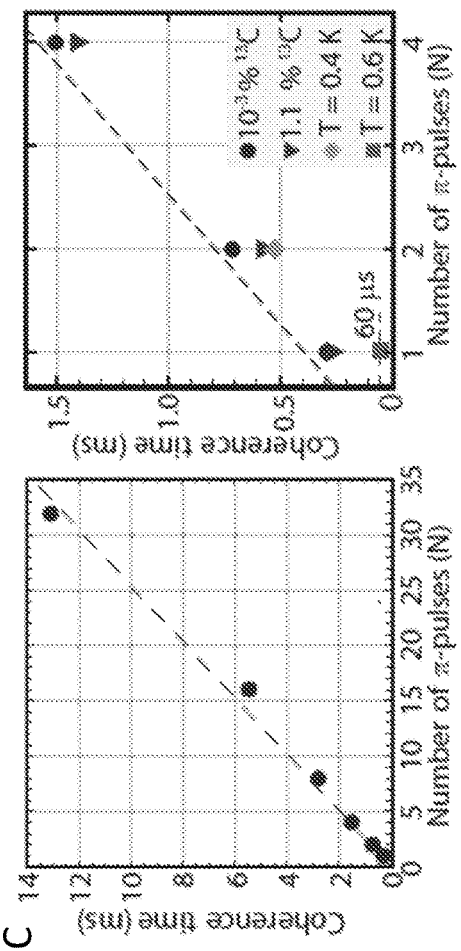
FIG. 4C
FIG. 4D

EXTENDED COHERENCE AND SINGLE-SHOT READOUT OF A SILICON-VACANCY SPIN IN DIAMOND

CROSS-REFERENCE TO RELATED APPLICATIONS

This application is a U.S. National Phase Application of PCT/US2018/046287, entitled "EXTENDED COHERENCE AND SINGLE-SHOT READOUT OF A SILICON-VACANCY SPIN IN DIAMOND," filed on Aug. 10, 2018, which claims the benefit of priority to U.S. Provisional Application No. 62/544,254, entitled "TEN-MILLISECOND COHERENCE AND SINGLE-SHOT READOUT OF A SILICON-VACANCY SPIN IN DIAMOND," filed on Aug. 11, 2017, the disclosures of each of which are hereby incorporated by reference in their entirety.

STATEMENT OF GOVERNMENTAL INTEREST

This invention was made with Government support under W911NF1520067 awarded by the U.S. Army Research Laboratory, FA9550-16-1-0323 awarded by the U.S. Air Force Office of Scientific Research, W911NF-11-1-0400 and W911NF-16-1-0173 awarded by the U.S. Army Research Office, FA9550-14-1-0052 awarded by the U.S. Office of Naval Research, and PHY-1125846 and PHY-1506284 awarded by the National Science Foundation. The Government has certain rights in this invention.

This invention was made with Government support under W911NF-14-2-0099 awarded by the U.S. Department of Defense, under FA9550-14-1-0052 and N00014-15-1-2846 awarded by the U.S. Office of Naval Research, under FA9550-16-1-0323 awarded by U.S. Air Force Office of Scientific Research, under W911NF1520067 awarded by U.S. Army Research Laboratory, under PHY-1125846, PHY-1506284 awarded by National Science Foundation. The Government has certain rights in this invention.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

TECHNICAL FIELD

This patent relates to quantum computing, and more specifically to preparing and evolving atomic defects in diamond.

BACKGROUND

Solid-state quantum emitters with spin-degrees of freedom such as charged quantum dots and nitrogen-vacancy (NV$^-$) centers in diamond have been investigated for various unique properties. Silicon-vacancy centers (SiVs), which are optically active defects in diamond substrates, are another such solid-state quantum emitter.

SUMMARY

According to some embodiments, a method of extending the coherence time in an electron spin qubit includes providing at least one of electron spin qubit, the at least one electron spin qubit comprising an SiV spin having a qubit frequency; cooling the at least one electron spin qubits to a temperature less than or equal to 500 mK; controlling the electron spin qubit by applying microwaves at the qubit frequency, wherein the electron spin qubit is manipulatable at the qubit frequency to transition from a first spin state to a second spin state, and wherein the transition from a first spin state to the second spin state encodes information; and optically reading out the second spin state of the electron spin.

According to some embodiments, the method further includes applying a magnetic field aligned along an axis of the at least one qubit.

According to some embodiments, the method further includes aligning the magnetic field to increase the signal to noise ratio of the optically reading out the second spin state of the electron spin.

According to some embodiments, the method further includes determining, prior to the coherently controlling the at least one electron spin qubit, the qubit frequency, wherein the qubit frequency is determined using pulsed optically-detected magnetic resonance.

According to some embodiments, the spin coherence time is greater than 100 nanoseconds.

According to some embodiments, the method further includes at least one dynamic decoupling step, wherein the dynamic decoupling step comprises providing at one Carr-Purcell-Meiboom-Gill (CPMG) pulse sequence comprising at least one π-pulse to the at least one electron spin qubit.

According to some embodiments, at least one of the first spin state and the second spin state is a superposition of two spin states.

According to some embodiments, the cooling further comprises cooling with a dilution refrigerator.

According to some embodiments, the applying microwaves at the qubit frequency further comprises applying the microwaves using a coplanar waveguide patterned on a substrate containing the at least one electron spin qubit.

According to some embodiments, the optically reading out the second spin state of the electron spin qubit comprises single-shot readout.

According to some embodiments, the optically reading out the second spin state of the electron spin qubit comprises applying at least one laser pulse to the spin.

According to some embodiments, the optically reading out the second spin state of the electron spin comprises reading out with an optical readout system, the optical readout system comprising an objective lens configured collect fluorescence light from the at least one electron spin qubit.

According to some embodiments, the objective lens is moveable along at least one axis via at least one piezoelectric stage to perform at least one of focusing the optical readout system, positioning the optical readout system relative to the at least one electron spin qubit, and scan the objective lens to perform confocal imaging.

According to some embodiments, the at least one electron spin qubit comprises a quantum register, and wherein the encoded information is a state of the register.

According to some embodiments, the at least one electron spin qubit comprises a node in a quantum communications network, and wherein the encoded information is part of a communication on the quantum communications network.

According to some embodiments, a system includes at least one electron spin qubit, the at least one electron spin qubit comprising an SiV spin having a qubit frequency, wherein the at least one electron spin qubit is optically addressable so that quantum information can be read out optically from the at least one electron spin qubit; a cooling system for maintaining the at least one electron spin qubit at a temperature of 500 mK or less; a magnetic field application structure alignable with the at least one electronic spin qubit; a microwave frequency source, operable at the qubit frequency of the SiV centers, configured to manipulate at least one electron spin qubit at the qubit frequency to transition from a first spin state to a second spin state, wherein the second spin state comprises encoded information; and an optical readout system configured to optically read out the second spin state.

According to some embodiments, the spin coherence time of the at least one electron spin qubit is greater than 100 nanoseconds.

According to some embodiments, the microwave frequency source comprises a coplanar waveguide patterned on a substrate containing the at least one electron spin qubit.

According to some embodiments, the coplanar waveguide comprises a superconducting material.

According to some embodiments, the microwave frequency source is further operable to apply at one Carr-Purcell-Meiboom-Gill (CPMG) pulse sequence comprising at least one π-pulse to the at least one electron spin qubit.

According to some embodiments, at least one of the first spin state and the second spin state is a superposition of two spin states.

According to some embodiments, the optical readout system comprises an objective lens configured collect fluorescence light from the at least one electron spin qubit.

According to some embodiments, the objective lens is moveable along at least one axis via at least one piezoelectric stage to perform at least one of focusing the optical readout system, positioning the optical readout system relative to the at least one electron spin qubit, and scan the objective lens to perform confocal imaging.

According to some embodiments, the optical readout system is configured to readout the second spin state of the at least one electron spin qubit using single-shot readout.

According to some embodiments, the optical readout system further comprises at least one laser source configured to apply at least one laser pulse to the at least one electron spin qubit.

According to some embodiments, the at least one electron spin qubit comprises a quantum register, and wherein the encoded information is a state of the register.

According to some embodiments, the at least one electron spin qubit comprises a node in a quantum communications network, and wherein the encoded information is part of a communication on the quantum communications network.

These and other capabilities of the disclosed subject matter will be more fully understood after a review of the following figures, detailed description, and claims. It is to be understood that the phraseology and terminology employed herein are for the purpose of description and should not be regarded as limiting.

BRIEF DESCRIPTION OF FIGURES

Various objectives, features, and advantages of the disclosed subject matter can be more fully appreciated with reference to the following detailed description of the disclosed subject matter when considered in connection with the following drawings, in which like reference numerals identify like elements.

FIGS. 1A-1J show aspects of SiV and control systems, according to some embodiments.

FIGS. 3A-3F show measurement characteristics, according to some embodiments.

FIGS. 4A-4D show extended spin coherence with dynamical decoupling, according to some embodiments.

DETAILED DESCRIPTION

Figure 1E:
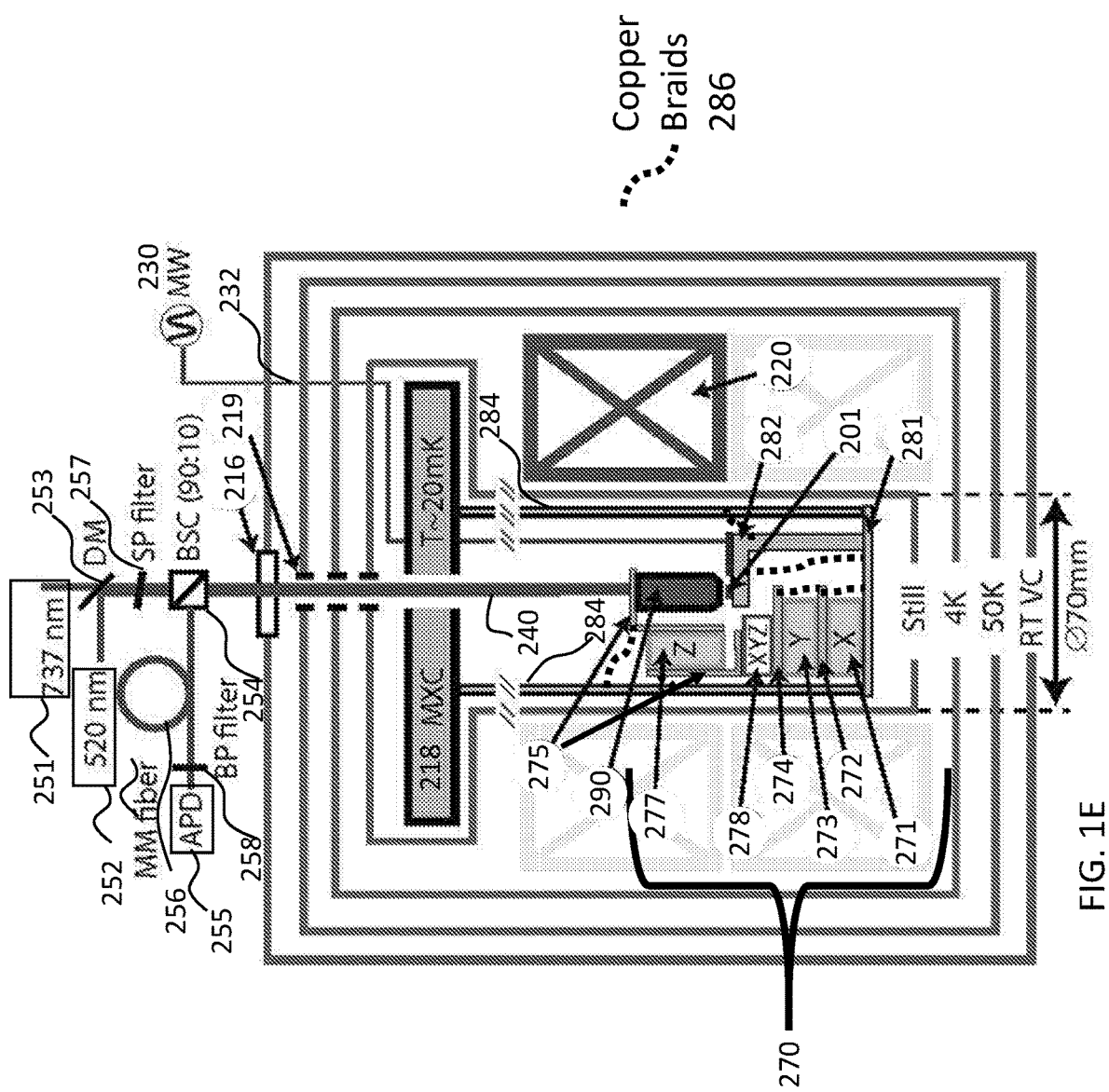

According to some embodiments, by extending the coherence time of SiVs, various applications can be realized. This may include using SiVs as electron spin qubits in various quantum systems. For example, SiVs may be used as solid-state quantum registers that can store quantum information in a long-lived memory, for example, based on an initial encoded state that lasts for longer than other existing solid-state quantum emitters. According to another example, SiVs may efficiently interface with optical photons to form the building blocks of a scalable quantum network of coupled SiVs that act as a communication network. To date, no solid-state quantum-emitter has yet been able to demonstrate both long storage times along with efficient interfacing with optical photons.

The optical coherence of the $SiV^-$ is protected by its inversion symmetry and is maintained in nanostructures. These optical properties can be used to control and/or entangle one or more $SiV^-$ centers in a single nanophotonic device. Such systems show strong single-photon single-emitter interactions. Without the systems or methods discussed in the present disclosure, $SiV^-$ spin coherence is limited to ~100 ns by the phonon bath at ~4 K. Thus, computing and communications applications for entangled $SiV^-$ spins are limited. As discussed herein, the coherence time of the $SiV^-$ spin can be extended by up to five orders of magnitude to 13 ms by operation below 500 mK, for example at 100 mK, thus allowing for use in a wider range of communications applications and as quantum registers. According to some embodiments, a dilution refrigerator may be used to cool the SiV spin system. According to some embodiments, the cooling system and other control systems may be designed to maintain low temperatures for the SiV spin system. For example, a microwave delivery structure, such as a coplanar waveguide (optionally superconducting) may be patterned directly on the diamond substrate containing the SiV spin system so as to apply microwaves for control of the spin system without significant heating of the $SiV^-$ system. According to another example, a piezoelectric stage is used to adjust an objective for laser control of the $SiV^-$ spin system and for imaging thereof. Various components discussed in more detail below may be implemented to allow for light application to and collection from the $SiV^-$ system in a manner that does not introduce significant additional heat, such as black body radiation. According to another example the $SiV^-$ system may be placed into a superconducting vector magnet within the dilution refrigerator to supply a tunable magnetic field to the system without significantly changing the temperature of the SiV system so as to control the SiV system. According to some additional embodiments, a spin echo sequence may be applied to cancel out other noise, such as external magnetic fields. According to some additional embodiments, magnetic field alignment may be performed to increase the signal to noise ratio. One or more of these examples and/or embodiments may be combined so as to produce a cumulative effect on the cooling and control enhancements, and therefore on the coherence time.

As shown in FIG. 1A, the ground state of the SiV$^-$ is split by spin-orbit interaction and crystal strain into two branches (LB and UB) separated by $\Delta_{GS}$. Each branch comprises two degenerate orbitals occupied by a spin-½ hole. Application of a magnetic field lifts the spin degeneracy, which allows the use of the spin-sublevels $|\downarrow\rangle$ and $|\uparrow\rangle$ of the lower branch LB as qubit states. At 4 K, the SiV spin coherence is limited to ~100 ns due to the interaction with the acoustic phonon bath at frequency $\Delta_{GS}$~50 GHz (relatively high frequency noise). Note that $\Delta_{GS}$ can be directly measured by looking at the frequency separation of the C and D transitions as shown in FIG. 1A. This varies from emitter to emitter due to local crystal strain in diamond. This results in a relaxation between the levels in LB and UB with different orbitals and the same spin projections at rates $\gamma_+$ and $\gamma_-$ as shown in FIG. 1A. The reduced occupation of phonon modes at $\Delta_{GS}$ at lower temperatures suppresses the rate $\gamma_+$, leaving the spin-qubit in a decoherence-free manifold. As shown in FIG. 1A, $\gamma_+$ is the rate of transition from LB to UB and may be directly related to the number of phonons present at ~50 GHz. Freezing out acoustic phonons can be observed as minimizing the ratio $\gamma_+/\gamma_-$.

According to some embodiments, the SiV$^-$ spin coherence may be probed at lower temperatures, for example 100 mK, by using a dilution refrigerator. Probing, as discussed in more detail below, may be performed with a free-space confocal microscope and a vector magnet. FIG. 1B shows an exemplary system for cooling and probing of a sample inside a dilution refrigerator, according to an embodiment. An objective 190 may be mounted on a motion stage 170, such as piezo positioners, via bracket 175 to image the diamond sample using, for example, free-space optics. The motion stage 170 may attached to the mixing plate 180 (having the SiV– sample thereon) of a dilution refrigerator and placed inside a superconducting vector magnet 120 for application of a magnetic field 125. The mixing plate 180, motion stage 170, and objective 190 may be placed in a shield 114, which may be held at a vacuum. According to an embodiment, the dilution refrigerator functions by utilizing the He$^3$/He$^4$ phase diagram. When He$^3$ is added to He$^4$ inside a mixing chamber, it naturally mixes while absorbing heat from the environment. The cooling power of this process is quite small, so several layers of shielding from the environment may be used. For example, vacuum can 110 may be an airtight shell which allows for the fridge to be evacuated of air, water, debris, etc. The second layer 112 may be radiation shielding which may be externally cooled, for example, to 4K using a pulse tube. This same pulse tube may cool the superconducting vector magnet 120. Optics 140 (for example, free space optics) connect the objective 190 to a nonpolarizing beam-splitter cube (BSC) 154 which allows for excitation light 150 to enter into the still 114 and for output light 155 to exit for collection and analysis. A microwave source 130 may also be provided, for example on the sample, as discussed in more detail below.

FIG. 1E shows a more detailed view of the system of FIG. 1B, according to an embodiment. According to some embodiments, it is desirable to provide for optical access to the sample 201 to allow for manipulation and observation thereof, where the optical access does not introduce a significant additional source of heat. Any suitable refrigerator, such as a BlueFors BF-LD250 cryogen-free dilution refrigerator (DR) may be modified to obtain free-space optical access. For optical excitation and collection, a confocal microscope may be used. SiVs may be excited resonantly with ~737-nm light from laser 251 and combined with an occasional off-resonant 520-nm pulses of light from laser 252 to reset the SiV charge state. The beams may be combined using a dichroic mirror (DM) 253. SiV fluorescence in the phonon side-band (PSB) may be collected using, for example, a 90:10 nonpolarizing beam-splitter cube (BSC) 254 to maximize the collected signal from the SiV, coupled to a multi-mode (MM) fiber 256, and sent to a single-photon detector (for example an APD) 255. For spectral filtering, the system may include a short-pass filter (SP) 257 in the excitation arm and band-pass filters (BP) 258 in the collection arm. The optics used to deliver light into and to collect light from the DR may be mounted on a breadboard (for example, the Thorlabs PBG12102) on top of the frame supporting the DR. This allows for DR venting and sample exchange without realignment of the optics. According to some embodiments, under continuous excitation with the resonant 737 nm light from laser 251, the SiV– system can lose an electron, causing the system to go dark and become unresponsive. When this happens, exciting with the 520 nm light from the laser 252 can restore the system. According to some embodiments the laser 251 is selected and/or tuned based on the properties of the quantum emitters being implemented, which may vary as discussed in more detail below and may be tuned via the magnetic field.

As shown in FIG. 1E, a collimated laser beam enters at the top of the DR through a vacuum viewport 216, such as a central line of sight port. The optical beam 240 from the vacuum viewport 216 may be focused on the diamond sample 201 by a low-temperature compatible objective 290. According to some embodiments, heat can be transferred via optical systems, which may make maintaining lower temperatures challenging. Accordingly, to reduce the heat load due to black-body radiation at the mixing chamber plate (MXC) 218 (which connects to the mixing chamber and therefore may be one of the coldest parts of the refrigerator and may, for example, be as cold as 8-10 mK), 10-mm apertures 219 may be installed at each stage inside the DR. In this configuration, the base temperature at the MXC may be, for example as low as 20 mK or lower. Although FIG. 1E does not show the use of any cold windows along the optical path inside the DR to allow in laser light but reflect blackbody radiation, such windows may be used at the vacuum viewport 216 and at apertures 219 to further keep temperatures down.

A magnet, such as a 6-1-1 T cryogen-free superconducting vector magnet 220 may mounted below the MXC 218 and thermally linked to the 4 K plate of the DR. The diamond sample 201 may be soldered with indium or fixed through another means to copper sample holder 282 and placed on science plate 281 inside the magnet bore of the magnet 220 using copper extensions 284 anchored to the MXC 218. This magnet may be operated in a persistent mode to reduce SiV$^-$ spin dephasing due to fluctuations of applied magnetic fields. A vented cryo-compatible objective 290 may be mounted on 3 single-axis piezo steppers 271, 273, 277 and 3-axis piezo scanner 278 via L-brackets 275. X-Y steppers 271, 273 may be mounted on the science plate 281. Copper braids 286 may be used to connect various components, such as the components 272, 274, 275, and 282, in order to provide better thermal transfer, for example to the science plate 281 and/or the copper bars 284. For example, the diamond sample holder 282 and the science plate 281 may be thermally anchored to the MXC via oxygen-free copper braids. Thermalization plates 272, 274 and the objective L-bracket 275 may also be thermally anchored to the science plate via copper braids. Piezo steppers 271, 273, 277 may move the objective 290 in 3 dimensions.

During operation, the focus of the objective may be adjusted with the stepper 277 and the other two steppers 271, 273 may be used for coarse positioning. Confocal images of the diamond sample may be performed by moving the objective 290 using piezo scanners 278. According to an alternative embodiment, another imaging system may be used and connected via an optical fiber. Optical resolution of the microscope may be ≈3 µm and may be limited by residual mechanical noise from a pulse tube and the collection pinhole diameter (25 µm) set by the MM fiber.

Microwave (MW) pulses 230 may be delivered to the diamond sample via coaxial lines 232 (for example, semi-rigid 2.19 mm SCuNi—CuNi lines between room temperature and 4 K, superconducting 0.86 mm NbTi—NbTi lines between 4K and MXC) which may be thermalized at each stage. A temperature sensor (for example Lake Shore Cryotronics®, RX-102B-CB) may be placed on the sample holder 282 and may measure a sample temperature of ≤100 mK in the absence of microwave driving. According to some embodiments, it is desirable to reduce the heat caused by delivery of the MW pulses.

According to some embodiments, MW pulses may be delivered by microwave delivery systems in proximity to the sample 201, such as shorted coplanar waveguide(s) (CPWs) fabricated on the diamond surface shown in FIGS. 1F-1H. FIG. 1F shows a room temperature micrograph of a shorted gold coplanar waveguides fabricated on the diamond surface 233. As shown in FIG. 1F, the coplanar waveguides 234, 235, 236 may be fabricated directly on the diamond sample surface 202. According to some embodiments, the coplanar waveguides may have bonding areas (not shown), where the on-chip CPW may be connected via aluminum wire to a MW printed circuit board (PCB), which may interface with microwave cables 232 leading out of the fridge. According to some embodiments, to fabricate these striplines, 50 nm (thickness) of Ti and 600 nm (thickness) of Au may be deposited onto the diamond surface using thermal evaporation. Next, a photolithography mask is patterned on the surface, and the unmasked Au and Ti may be selectively etched away using, for example Transene Gold Etchant Type TFA diluted 2:1 with water for 2 min, then 5.6% HF by weight (49% HF diluted 9:1 with water) for 30 s. According to some embodiments, the coplanar waveguide may be fabricated with widths of approximately 5 microns and lengths of approximately 95 microns. FIG. 1G shows a low temperature reflection image of the diamond surface 233 and the coplanar waveguide 236, 235 (234 not shown), overlaid with a photoluminescence excitation (PLE) image 203 of an SiV−. FIG. 1H shows a cross-section of the SiV− PLE image. The optical resolution is 3 µm.

Reduction in Phonon Noise

According to some embodiments, the polarization of the SiV into the LB between 0.1K and 10K may be studied using an ensemble of as-grown SiV⁻ centers as a sample in order to determine the effects of low temperature on the sample. As discussed below, lower temperatures produce higher populations in LB which are indicative of less influence by the phonon bath, which, as discussed in the present application, significantly increases coherence time. In other words, probing a reduced UB population results from fewer phonon induced transitions. The relative populations in the LB and UB may be probed by measuring the ensemble photoluminescence excitation (PLE) spectra of transitions C and D shown in FIG. 1A. The relative intensity of the C and D transitions may directly indicate the relative population in LB and UB. As shown in FIG. 1C, transitions C and D are both visible in PLE at 4K (dashed line) which suggests comparable thermal population in the LB and UB. For a temperature of 0.1K, only the transition C are visible, indicating that there is very little population in UB, which is indicative of fewer phonon-induced transitions. As shown in FIG. 1D, as the temperature is lowered, the ratio of the transition D and C peak amplitudes (ID/IC) reduces by more than two orders of magnitude and follows $e^{-h\Delta_{GS}/k_B T}$. FIG. 1D shows the ratio following $e^{-h\Delta_{GS}/k_B T}$ with $\Delta_{fit}$=41 GHz in agreement with the measured $\Delta_{GS}$=48 GHz. These measurements demonstrate an orbital polarization in the LB of >99% below 500 mK. Therefore, at these low temperatures, $\gamma_+ \ll \gamma_-$ (implying very few photons at $\Delta_{GS}$~50 GHz) and the qubit states are effectively decoupled from the phonon bath.

Effect of a Third State

Figure 1J:
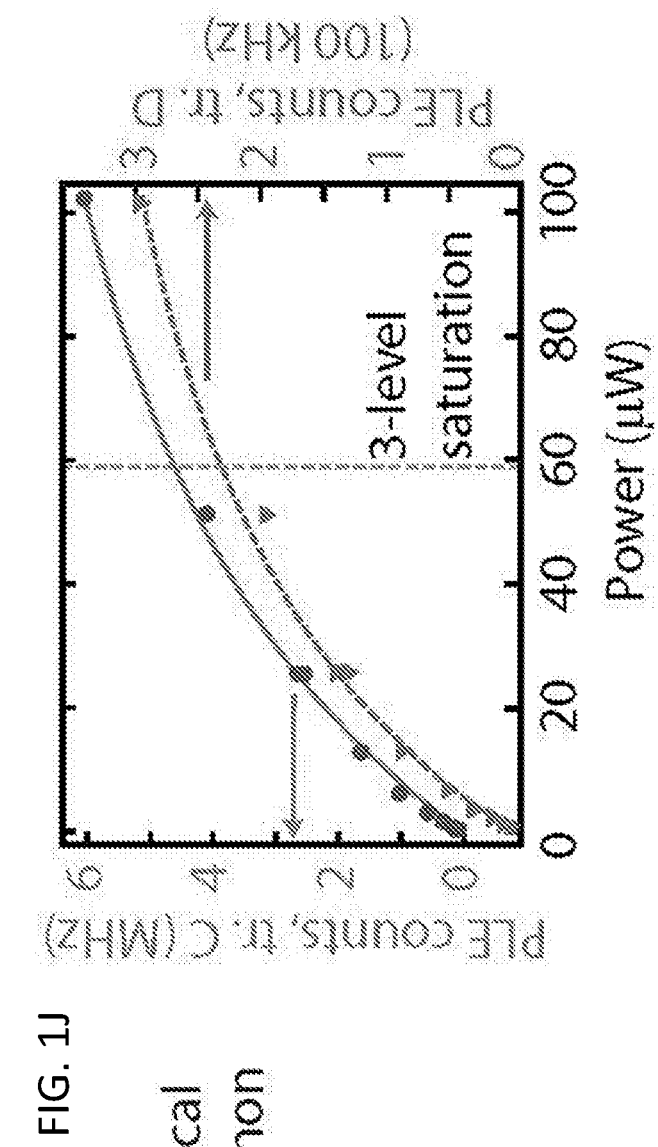
Figure 1I:
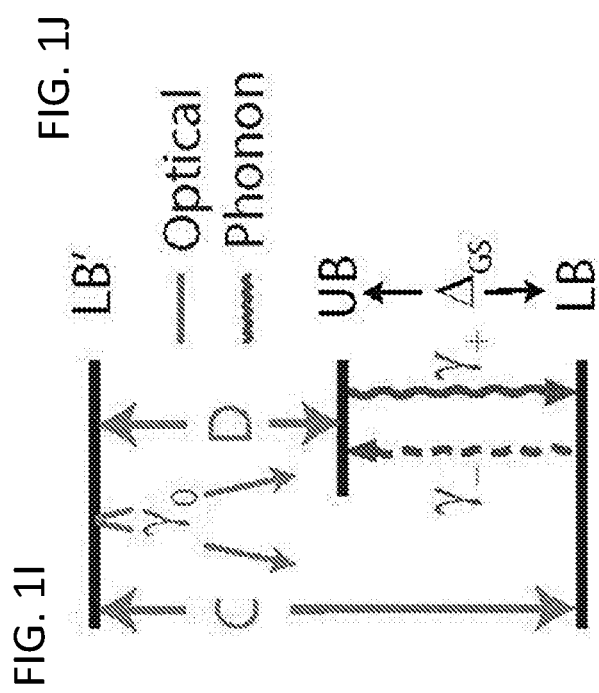

According to an embodiment, laser driving can also affect steady-state population of the UB or the LB via optically pumping to the opposite branch (See FIG. 1I). Since there exists a third level, the relative intensity of C and D can saturate, meaning that transition C or D amplitude may no longer be equated with the LB or UB populations, respectively. As discussed herein, using constant laser power at T<1K does not risk saturating the transition. Thus, the experimental observations discussed above with respect to the LB and UB populations are valid. FIG. 1I shows relaxation rates in the three-level system formed by the LB and the UB of the SiV⁻ ground state and the first excited state (LB₀). γ₀ is the total decay rate from the excited state; γ₊(γ₋) is the upward (downward) phonon relaxation rate. This effect is minimized when laser power is below the three-level saturation intensity set by the decay rate of the excited state (γ0) and the phonon relaxation rates (γ↑ and γ↓). Solving master equations for the corresponding 3-level system shows that at temperatures T<1 K, for which the thermal population of phonon modes at the frequency $\Delta_{GS}$ is n (T, $\Delta_{GS}$)→0, the saturation intensity is $\propto \gamma_\downarrow/\gamma_0$. The downward phonon relaxation rate is $\gamma_\uparrow \propto$(n (T, $\Delta_{GS}$)+1) and does not depend on T in this regime. Thus, saturation intensity is also constant for T<1 K.

In FIG. 1J, PLE counts for transitions C and D are shown at different laser powers at the fixed T=0.75 K. The upper plot (dots) corresponds to transition C and is displaced vertically for clarity. The lower plot (triangles) corresponds with D transitions. For both transitions, saturation corresponds to a laser power of ~60 µW. Since at T=0.75 K, n<0.1, saturation intensity does not change at lower T and can only increase at higher temperatures due to faster phonon relaxation.

As shown in FIG. 1D, a laser power of 0.5 µW may be used, and thus observation may be performed deep below 3-level saturation for the whole temperature range. In this case, the ratio of PLE counts D/C shown in FIG. 1D is proportional to the ratio of the thermal populations of the LB and the UB of the SiV− ground state as discussed in more detail herein.

Single Emitters

Although SiV ensembles may be used for various implementations of quantum networks and computing, single SiV emitters may be used for certain quantum computing schemes. As discussed below, the properties of a single SiV emitter remains constant across numerous instances of exemplary systems. To investigate the coherence properties of single emitters, single SiV centers may be provided at a depth of ~250 nm via $^{28}$Si ion implantation into electronic grade diamond. According to an exemplary experimental embodiment, a first diamond sample (Sample-13) has a natural abundance of 1.1% of $^{13}$C isotopes with a nuclear spin I=½. A second sample (Sample-12) is engineered to have only $10^{-3}$% of $^{13}$C to suppress the hyperfine interaction of the spin qubit with the nuclear spin bath. After ion implantation and high-temperature annealing, a shorted coplanar waveguide may be fabricated on the diamond to drive microwave transitions as discussed in more detail above with respect to FIGS. 1F-1J.

Quantum Transitions for Communication and/or Storage of Information

Figure 2C:
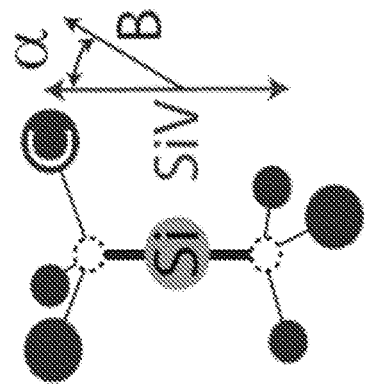
FIGS. 2A-2I show single-shot spin readout characteristics and magnetic field responses, according to some embodiments.
Figure 2B:
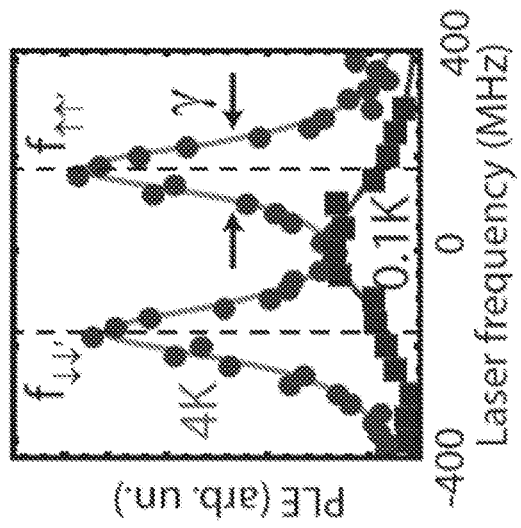
Figure 2A:
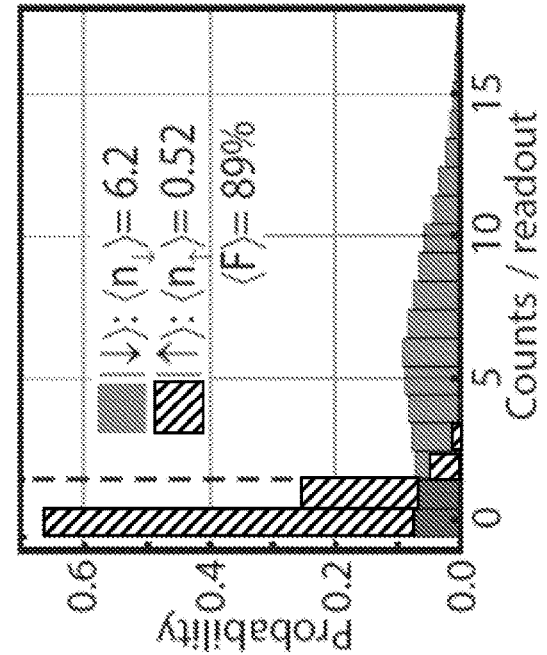
Figure 2E:
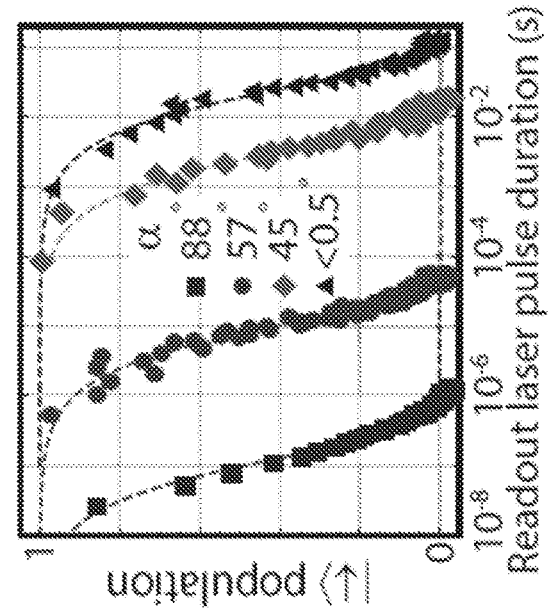
Figure 2D:
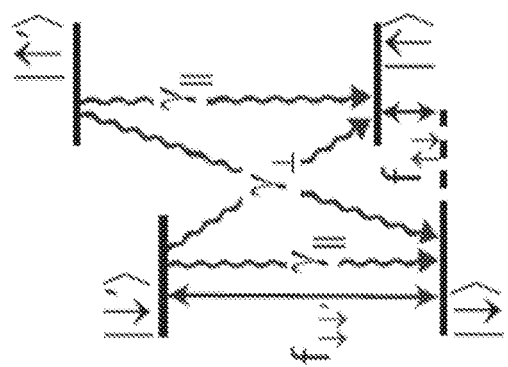

According to some embodiments, as shown in FIG. 2A, spin-selective optical transitions $|i\rangle \rightarrow |i'\rangle$ may be used at frequencies $f_{ii'}$ (i={↑, ↓}) to optically initialize and readout the qubit states. To initialize the SiV$^-$ qubit, in state $|\uparrow\rangle$ for example, the spin-resolved transition $|\downarrow\rangle \rightarrow |\downarrow'\rangle$ may be driven. Optical pumping using a laser at $f_{\downarrow\downarrow'}$ for a time much longer than $t_p$ (see FIG. 2A) eventually brings the qubit into state $|\uparrow\rangle$. According to some embodiments, the initialization procedure can connect any of the ground ($|\downarrow\rangle$, $|\uparrow\rangle$) and excited ($|\downarrow'\rangle$, $|\uparrow'\rangle$) states together ($|\downarrow\rangle \rightarrow |\downarrow'\rangle$ etc.) and produce photons proportional to the population in the ground state. During this process, population may naturally leak away to the opposite ground state ($|\downarrow\rangle \rightarrow |\downarrow'\rangle$ leaks population to $|\uparrow\rangle$, for example). Thus, during the first δt seconds a laser connecting $|\downarrow\rangle \rightarrow |\downarrow'\rangle$ may read out the population P($|\downarrow\rangle$) and continue for the next T seconds controllably leaking all population into $|\uparrow\rangle$, initializing the system to a known spin state. For higher initialization fidelity, the initialization laser pulse may be several times longer than the characteristic time $t_p$ for optical pumping (see FIG. 2D showing the population in $|\downarrow\rangle$ as a function of readout pulse duration for various field angles). The qubit states may be optically read out by driving the corresponding spin-conserving transition. For better readout signal-to-noise, the duration of the readout pulse may be kept to less than the optical pumping time $t_p$. Since the noise in this measurement scales $\sim N^{-1/2} + \alpha N$ where α is an experimental parameter associated with laser background and pumping time. For different realizations of a there exists some optimal value N to maximize the signal to noise. Intensities of both initialization and readout pulses may be, for example, at 3-level saturation.

Magnetic Field Control and Alignment

Application of a magnetic field |B|~0.5-3 kG allows for optical resolution of the transitions discussed, for example, above. $f_{ij}$ is the transition frequency between states i and j. γ∥ and γ⊥ are spin-conserving and spin-flipping decay rates respectively. $f_{\downarrow\uparrow}$ it is the qubit frequency. FIG. 2B shows the PLE spectrum measured at 4 K (dots) and 0.1 K (squares) of the spin-selective optical transitions at 4 K, demonstrating that the lasers $f_{\downarrow\downarrow'}$ and $f_{\uparrow\uparrow'}$ are resolvable and thus can perform initialization and readout as described above. γ=130 MHz is the optical linewidth. At 100 mK, the two transitions are not observable using a single laser which pumps the system to a dark spin state with a lifetime of T1>1s, thus showing a long maximum memory time. The central peak at 100 mK originates from off-resonant repumping from the dark spin state.

To achieve high-fidelity readout of the spin-states, it is desirable to scatter photons many times without causing a spin-flip. To obtain such spin-conserving optical transitions, the cyclicity of the transition $\gamma_\parallel/(\gamma_\perp + \gamma_\parallel)$ can be tuned by varying the angle α of the applied magnetic field with the SiV symmetry axis as shown in FIG. 2C. FIG. 2C is a schematic of the SiV$^-$ molecular structure. α is the angle between the magnetic field $\vec{B}$ and the SiV symmetry axis set by the two lattice vacancies (empty circles). The cyclicity of the spin-conserving transitions depends on the angle between the SiV symmetry axis and applied magnetic field $\vec{B}$. According to some embodiments, the procedure disclosed herein may be used to align the magnetic field to the SiV symmetry axis with 0.1" precision. The SiV symmetry axis can be pointed along four possible ⟨111⟩ orientations in the diamond lattice. Based on the Hamiltonian, the Zeeman splittings of the ground states and excited states depend on both the orientation of the magnetic field and the amount of strain in the crystal.

Figure 2G:
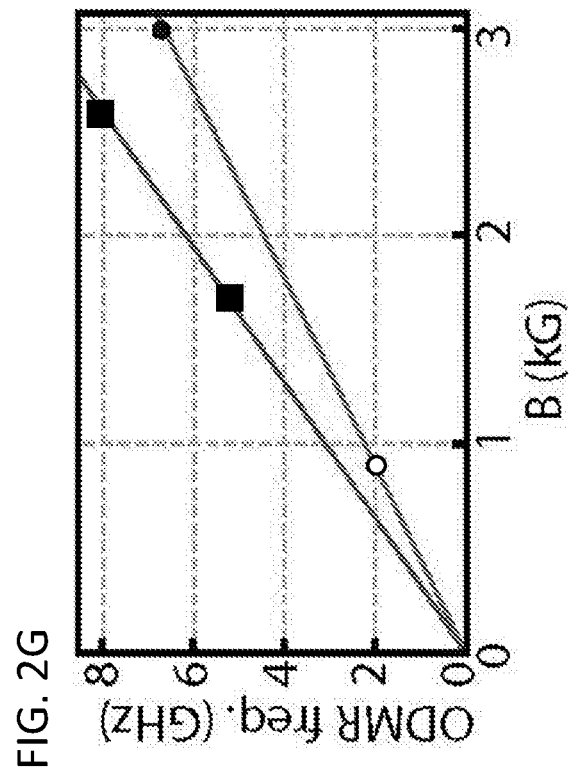
Figure 2F:
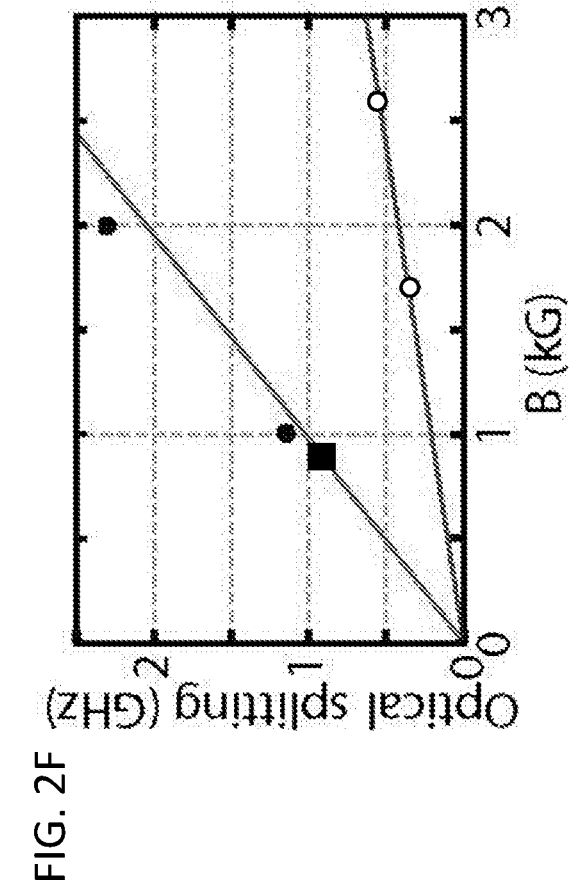

For strained emitters with 50 GHz <$\Delta_{GS}$<100 GHz, off-axis magnetic fields lead to a larger Zeeman splitting in the ground states compared with the excited states. Magnetic fields along the symmetry axis, however, result in a comparable Zeeman splitting in ground and excited states. As shown in FIG. 2F, this leads to a larger frequency splitting between spin-conserving transitions for misaligned fields. As shown in FIG. 2F, squares represent orthogonal field for SiV− with $\Delta_{GS}$=75 GHz in Sample 12; hollow dots represent the same SiV− in an aligned field; and black dots represent SiV with $\Delta_{GS}$=85 GHz in Sample 13 in an orthogonal field. Solid lines are linear fits. This approach can be employed to determine the orientation group of an SiV center. In other words, field orientation may be adjusted, and the optical splitting measured in order to extrapolate the relative angle between the field and the SiV center. FIG. 2G shows ODMR data for the same samples.

Figure 2I:
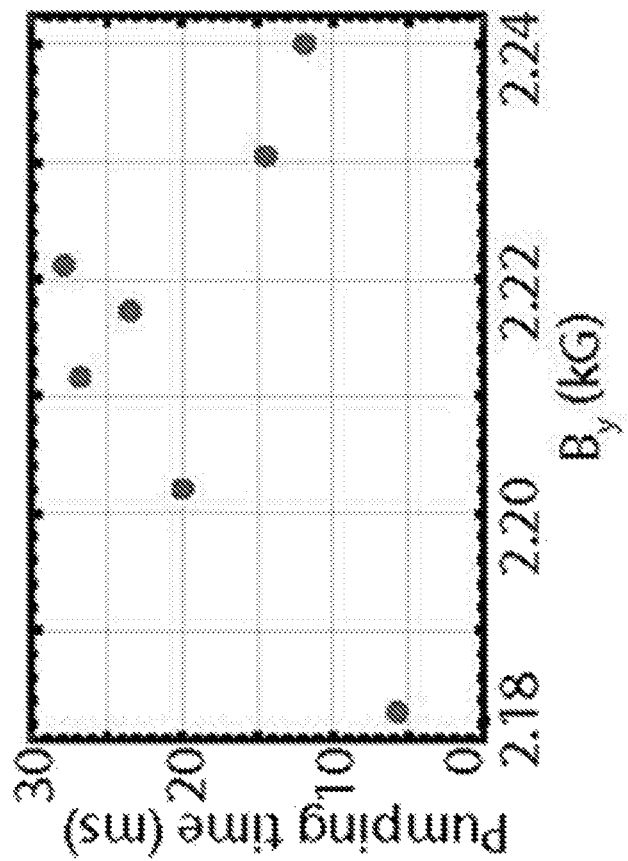
Figure 2H:
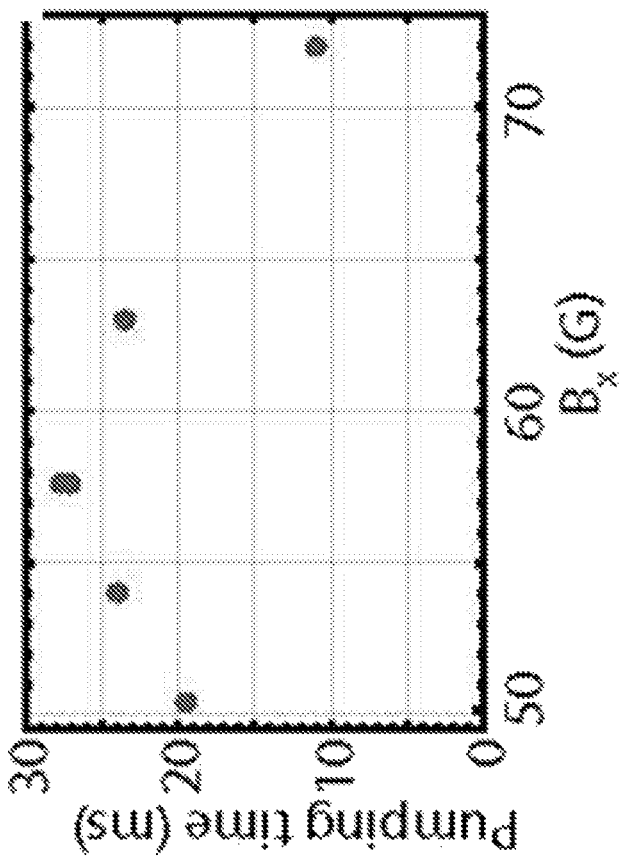

For a given SiV−, a magnetic field may be applied along all 4 possible SiV orientations ⟨111⟩. Based on the discussion above, the smallest optical splitting corresponds to the magnetic field pointed along the SiV axis. Finally, the orientation of the magnetic field may be fine-tuned by probing SiV spin dynamics. FIGS. 2H and 2I shows measured optical spin pumping times at different field orientations. FIG. 2H shows optical pumping times at different $B_x$ at {$B_y$=2.2 kG, $B_z$=1.5 kG}. FIG. 2I shows optical pumping times at different $B_y$ at {$B_x$=63 G, $B_z$=1.5 kG}. These measurements indicate that, according to some embodiments, the spin dynamics are very sensitive to the magnetic field orientation and a precision of ~0.1° degrees is beneficial to scatter photons for 30 ms without a spin flip. According to some embodiments, the alignment may be selected based on desired signal and noise characteristics. Better alignment allows for more signal but increases noise. Accordingly, alignment may involve increasing or maximizing the signal to noise ratio based on field alignment.

FIG. 2D shows the optical spin pumping timescale for different α when the transition $f_{\downarrow\downarrow'}$ is driven near saturation. According to some embodiments, the optical pumping timescale is excited by more than five orders of magnitude from 100 ns for α~90° to 30 ms in aligned field. As shown in FIG. 2D, {α, |B|, τ}={88°, 2.9 kG, 140 ns} for squares; {57°, 3.0 kG, 10 μs} for circles; {45°, 1.7 kG, 3 ms} for diamonds; {<0.5°, 2.7 kG, 30 ms} for triangles. According to some embodiments, by tuning the magnet, it is possible to improve the signal gained during readout to the single shot regime, which drastically improves the quality of the data gathered.

The ability to optically excite the SiV~$10^5$ times without causing a spin-flip enables high-fidelity single-shot readout of the spin state despite the low photon collection efficiency (~$10^{-4}$) in the phonon-sideband (PSB). According to some embodiments, the spin-state may be read out by driving the $f_{\downarrow\downarrow'}$ transition near saturation (indicative of maximizing signal to noise ratio) and monitoring fluorescence on the PSB. FIG. 2E shows the readout count distributions for the spin initialized in state $|\downarrow\rangle$ (solid histogram) and $|\uparrow\rangle$ (striped histogram) using a 150 ms-long pulse from a second laser at frequency $f_{\uparrow\uparrow'}$ and $f_{\downarrow\downarrow'}$ respectively. A laser pulse at frequency $f_{\downarrow\downarrow'}$ or $f_{\downarrow\downarrow'}$ for example, for 20-ms long, may be used for state readout. As shown in FIG. 2E, ⟩according to an experimental embodiment $\langle n_\downarrow\rangle=6.2$ photons from state $|\downarrow\rangle$ and $\langle n_\uparrow\rangle=0.52$ from state $|\uparrow\rangle$. By choosing a state-detection threshold of n>1 for state $|\downarrow\rangle$ and n<1 for state $|\uparrow\rangle$, an average readout fidelity of $F=(F^\uparrow T+F_\downarrow)/2=0.89$ may be obtained where $F_i$ is the readout fidelity for state i. For the experimental embodiments measured in FIGS. 3 and 4, the magnetic field was roughly aligned with $\alpha<5°$ to operate in an efficient spin readout regime. Further optimizing experimental conditions {$\alpha$, |B|, $\tau$} may result in higher fidelity.

Microwave Control

According to some embodiments, coherent control the SiV$^-$ electron spin qubit is carried out using microwave transitions (for example, using the coplanar waveguide discussed above with respect to FIGS. 1E-1H) at frequency $f_{\uparrow\downarrow}$. In a low-strain lattice, the qubit states have orthogonal spin and orbital wave-functions and a magnetic dipole transition between the qubit states is only weakly allowed. According to an embodiment, SiV$^-$ centers with $\Delta_{GS}\approx70$ GHz for which the magnetic dipole transitions become allowed are used. SiV$^-$ may be placed <2 µm from the coplanar waveguide to efficiently drive the qubit transition using low microwave powers and maintain a steady-state sample temperature below 100 mK. $\Delta_{GS}$ can be directly measured by looking at the frequency separation of the C and D transitions. This varies from emitter to emitter due to local crystal strain in diamond.

FIG. 3C demonstrates coherent control of the SiV spin qubit. By applying MW pulses of various duration, the spin can be deterministically prepared in $|\downarrow\rangle$ (lower dashed line) $|\uparrow\rangle$ (upper dashed line) or a quantum superposition $\alpha|\downarrow\rangle+\beta|\uparrow\rangle$ (between the dashed lines). The initialization measurements (FIG. 2) shows preparation into $|\downarrow\rangle$ or $|\uparrow\rangle$. According to some embodiments, this superposition state is helpful for quantum processing. The qubit frequency f T can be identified using a pulsed optically-detected magnetic resonance (ODMR) measurement as shown in FIGS. 3A and 3B. A laser pulse delivered through the optics discussed above at frequency $f_{\downarrow\downarrow'}$ (note: this frequency varies from emitter to emitter and can be tuned via adjusting the magnetic field, but may be, for example, approximately 737 mm) initializes the spin in state $|\uparrow\rangle$ via optical pumping. After a microwave pulse of duration $\tau$ is provided via the coplanar waveguide, a second laser pulse at the same frequency $f_{\downarrow\downarrow'}$ reads out the population in state $|\downarrow\rangle$. After finding the ODMR resonance by scanning the microwave frequency (FIG. 3B), the qubit transition may be driven on resonance and the Rabi oscillations observed as shown in FIG. 3C. FIG. 3C shows resonant driving at frequency $f_{\downarrow\uparrow}$ resulting in Rabi oscillations between states $|\uparrow\rangle$ and $|\downarrow\rangle$.

The SiV states $|\uparrow\rangle$ and $|\downarrow\rangle$ can be used as a spin qubit. In a small aligned magnetic field B ($\mu_B B \ll h\lambda_{SO}$), these states may be of the form $$|\uparrow\rangle = |\uparrow\rangle_{spin} \otimes \left(|e_-\rangle + \frac{1-\sqrt{1+\xi^2}}{\xi}|e_+\rangle\right) \quad (1)$$

$$|\downarrow\rangle = |\downarrow\rangle_{spin} \otimes \left(|e_+\rangle + \frac{1-\sqrt{1+\xi^2}}{\xi}|e_-\rangle\right) \quad (2)$$

where $\alpha$ is an off-diagonal ($E_g$) strain, $\lambda_{SO}\approx46$ GHz is the spin-orbit coupling in the ground manifold of the SiV ($\Delta_{GS}=\sqrt{\alpha^2+\lambda_{SO}^2}$); $|\uparrow\rangle_{spin}$ and $|\downarrow\rangle_{spin}$ are spin states; and $|e_-\rangle$ and $|e_+\rangle$ are orthogonal electronic orbital states.

Figure 3F:
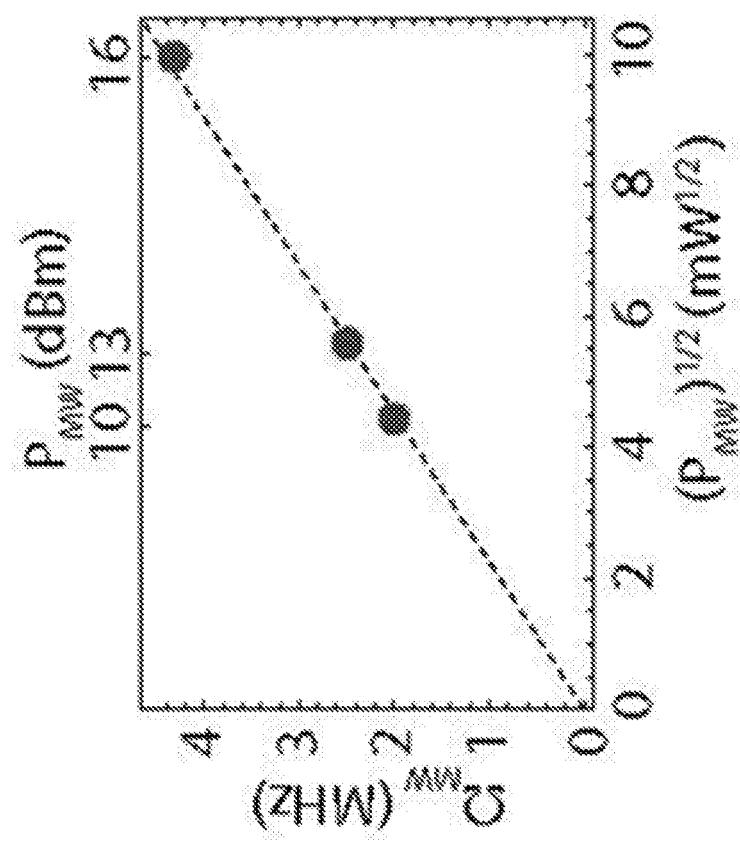

To coherently manipulate the SiV spin qubit, the transition $|\uparrow\rangle\rightarrow|\downarrow\rangle$ may be driven with resonant MW pulses with Rabi $$\Omega_{MW} \sim \sqrt{P_{MW}} \cdot \frac{1-\sqrt{1+\xi^2}}{\xi},$$

where $P_{MW}$ is the MW power. A square-root dependence of $\Omega_{MW}$ on the MW power can be verified as shown in FIG. 3F. FIG. 3F shows the frequency of MW Rabi oscillations ($\Omega_{MW}$) at different MW powers ($P_{MW}$) delivered to the dilution fridge. The power at the sample is reduced by an estimated ~5 dB due to losses in the coaxial lines, according to some embodiments. The dashed line is a linear fit. Data discussed herein was taken at $f_{\downarrow\uparrow}=6.6$ GHz (Note: this may be tuned by varying the magnetic field, see FIG. 2G).

In the low strain regime ($\alpha<\lambda_{SO}$), the qubit magnetic dipole transition $|\downarrow\rangle\rightarrow|\uparrow\rangle$ is only weakly allowed. This makes a coherent control of the spin with the MW driving difficult due to heating of the sample via ohmic losses in the gold stripline. According to some embodiments, SiV centers with $\Delta_{GS}\approx80$ GHz may be used. A corresponding moderate crystal strain of $\alpha\approx1.5\lambda_{SO}$ allows the qubit transition and reduces the necessary amount of MW power. This facilitates maintaining a steady-state sample temperature of ~100 mK.

According to some embodiments, Ramsey interference can be used to measure the inhomogeneous spin dephasing time $T_2^*$ for both samples as shown in FIG. 3D. For experimental Sample-12 containing a low density of nuclear spins (black dot data), a Ramsey decay time, which is an indicator of the intrinsic quantum memory time, is measured in the range of $T_2^*=1.5$ µs to 13 µs. $T_2^*$ scales inversely with the qubit frequency $f_{\downarrow\uparrow}$ as shown in FIG. 3E. The observed scaling $T_2^*\approx1/f_{\downarrow\uparrow}$ indicates that fluctuations of the electronic g-factor $\Delta g$ likely limit the $T_2^*$ via the relation $1/(T_2^*)\approx\Delta g\mu_B|B|$ where $\mu_B$ is the Bohr magneton. For Sample-13 which contains a natural abundance of nuclear spins (open circle data), $T_2^*=270$ ns which is similar to typical values observed with nitrogen-vacancy centers. These results demonstrate that the Ramsey decay time $T_2^*$ of SiV$^-$ centers in the Sample-13 may be primarily limited by the nuclear spin bath in the diamond host with natural abundance of $^{13}$C.

The measurements discussed above show that $T_2^*$ can scale approximately inversely with the static magnetic field in the isotopically purified sample (Sample 12). As discussed in more detail below, a microscopic mechanism can be implemented that can lead to the observed $(T_2^*)^{-1}\propto g\mu_B B$ dependence. The wavefunction of the spin qubit consists of both an electronic orbital and a spin degree of freedom that each can contribute to the electronic Lande g-factor.

The electronic orbitals $|e_-\rangle$ and $|e_+\rangle$ can be mixed via strain and large electric fields. The mixing mechanism via strain described in more detail above. While electric fields may not mix the two orbitals $|e_-\rangle$ and $|e_-\rangle$ that have the same parity to first order, second-order processes (mediated by the excited states of the opposite parity) can result in a mixing between the two orbitals. The presence of such electric or strain field fluctuations can therefore lead to fluctuation of the orbital wavefunctions and a corresponding change in the g-factor of the qubit states. This can cause a spin dephasing at a rate proportional to an applied magnetic field B.

The resulting $T_2^*$ also limits the single qubit gate fidelities. MW Rabi frequencies $\Omega_{MW}$ may be set in the range from 1 to 10 MHz. In this case, MW π-time of ~100 ns is comparable with $T_{2*}$, resulting in imperfect MW π-pulses with errors at the percent level. For CPMG sequences involving 32 rephasing π-pulses (see description associated with FIG. 4B below) this results in a reduction of the state fidelity to ~70% level, according to some embodiments. According to some embodiments, stronger MW driving (corresponding to larger $\Omega_{MW}$) causes heating of the sample due to Ohmic losses in a gold coplanar waveguide which degrades spin coherence (see FIG. 4D). By using low-loss superconducting coplanar waveguide for MW delivery, larger $\Omega_{MW}$ can be achieved without additional heat load.

CPMG Techniques

Dephasing due to slowly evolving fluctuations in the environment (e.g. nuclear spins) can be suppressed by using dynamical decoupling techniques. According to an embodiment, the spin coherence time $T_2$ can be extended by implementing Carr-Purcell-Meiboom-Gill (CPMG-N) sequences with N=1; 2; 4; 8; 16, and 32 rephasing pulses in Sample-12 (see FIG. 4B). FIG. 4A shows a CPMG sequence with N rephasing MW π-pulses, according to an embodiment. A first laser pulse (for example from the laser 252) is used to initialize the sample. Then, a half-π MW pulse is applied followed by N rephasing MW π-pulses separated by τ. Finally, a second half-π pulse is applied followed by readout via the laser. According to an experimental embodiment, the measured $T_2$ time may be extended up to 13 ms for N=32. State fidelity reduces with higher N due to π-pulse errors. Accordingly, the number of π-pulses maybe selected in order to optimize both $T_2$ and state fidelity.

FIG. 4C shows that the coherence time $T_2$ increases linearly with the number of rephasing pulses N (plotted and fit as $T_2$ coherence vs. number of rephasing pulses N for the Sample-12). The longest observed coherence time is $T_{2=13}$ (1.7) ms for N=32. According to an experimental embodiment, CPMG sequences in Sample-13 demonstrate the same coherence times $T_2$ as for Sample-12 (FIG. 4C). FIG. 4D shows CPMG measurements at higher temperatures (plotted and fit as $T_2$ coherence vs. number of rephasing pulses N for the Sample-12 and Sample-13 and at elevated temperatures). At 400 mK, $T_2$ time with CPMG does not significantly change (diamond and upside-down triangle data). However, according to an experimental embodiment, increasing the temperature up to 600 mK reduces the single echo $T_2$ to 60 μs. Thus, it is desirable to use temperatures less than 600 mK, for example less than 500 mK, less than 450 mK, less than 400 mK, less than 400 mK, less than 200 mK, or less than 100 mK but not less than 8 mK. According to some embodiments, different refrigeration techniques are used to produce an environment less than 8 mK. According to some embodiments, the lower bound on temperature is set by the cooling system and is not limiting for purposes of the system and methods disclosed herein.

Figures 5A, 5B:
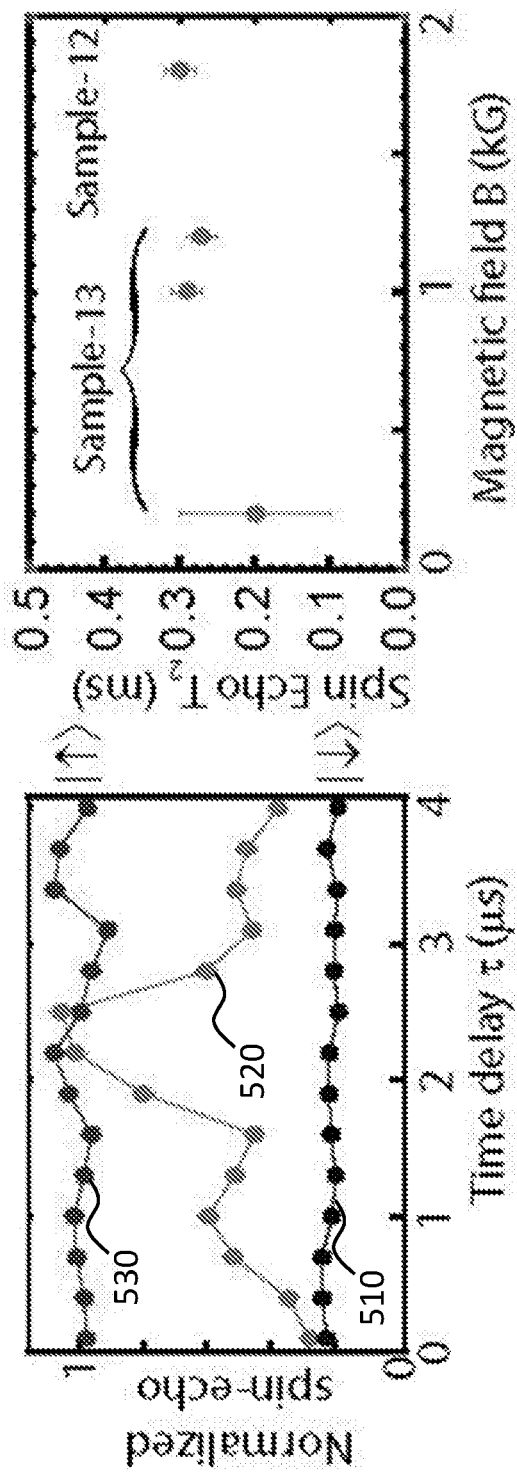
FIGS. 5A-5B show spin echo at different magnetic fields, according to some embodiments.

The experimental measurements shown in FIGS. 3A-3E demonstrate that $T_2$ of SiV⁻ spins in the Sample-13 is primarily limited by the nuclear spin bath. The measurements in FIGS. 4B-4D show that the $T_2$ coherence is not limited by the nuclear spin bath but by another noise source. This observation is also supported by the observed linear scaling ($T_2$~N) of coherence with the number of π-pulses which deviates from the expected ~$N^{2/3}$ scaling for dipolar coupling to nuclear spins. A significant difference between $T_2$ measured at different magnetic fields has also been identified, for example, as shown in FIG. 5B. Notably, increasing the number of pulses linearly improves $T_2$. Thus, more sophisticated MW control (both amplitude and phase) is possible.

The linear dependence of $T_2$ to N suggests that the $T_2$ can potentially be further improved by using more rephasing pulses. In the measurements that produced FIGS. 4B-4D, errors due to imperfect π-pulses result in reduced state fidelities for pulse sequences with N≥32. Pulse errors can be reduced by using decoupling sequences with two-axis (XY) control (for example, by implementing a MW source with phase control) and/or by fabricating higher-power, lower-dissipation superconducting MW coplanar waveguides. A superconducting MW coplanar waveguide could be formed by replacing the Ti/Au deposition discussed above with respect to FIGS. 1F-1G with a superconductor (for example, using Niobium-Nitride or Niobium-Titanium-Nitride).

ADDITIONAL EXAMPLES

These exemplary results establish the SiV⁻ as the first solid-state quantum emitter with a deterministic interface to single photons and a long-lived quantum memory, opening up new possibilities in quantum devices. The achieved coherence time of 10 ms is sufficient to build quantum repeater nodes separated by as much as $10^4$ km. The coherence time could be further extended by implementing more robust dynamical decoupling schemes such as phase controlled MW sources. Observed coherent coupling between SiV⁻ electron spin and few nearby nuclear spins provides an access to a second-long nuclear spin memory. The SiV nodes operating at dilution fridge temperatures can strongly couple to superconducting quantum circuits via electromechanical transducers by exploiting the large strain susceptibility (PHz per unit strain) of the SiV⁻. The strong coupling of SiV⁻ to localized acoustic and photonic modes allows for creation of two-qubit gates via resonator modes (i.e., a coupled SiV and a mechanical resonator) and optomechanical generation of single telecom-band photons from a long-lived memory for long-distance quantum communication. A single SiV⁻ in a nanophotonic device can also be used to build 2D photonic cluster states for measurement-based quantum computation with minimal resources. For example, a pulsed laser could be used to excite the SiV selectively depending on the spin state, which may give rise to entanglement between successive pulses from the laser.

According to some embodiments, the effect of a $^{13}C$ nuclear spin on a spin-echo signal depends on the ratio of the external magnetic field and the magnetic field produced by an SiV⁻ at the nuclear site (Knight shift). In a large external magnetic field of 3 kG, this Knight shift is negligible and has little to no observable effect of nuclear spins in the spin-echo measurements (see lower plot 510 in FIG. 5A). FIG. 5A shows Spin-echo (CPMG-1) curves for τ<4 μs with data 510 for spin echo at B=0.2 kG; data 520 corresponding to spin echo at B=3 kG; and data 530 corresponding to spin echo at B=3 kG. According to an experimental embodiment, this measurement can be repeated with a spin echo sequence modified such that the second π/2 pulse was replaced by a 3π/2 pulse (plot 520). This allows for normalization of the readout signal. The mean value of the spin-echo (modified spin-echo) signal at $\tau \ll T_2$ corresponds to find the SiV$^-$ spin in state $|\uparrow\rangle$ ($|\downarrow\rangle$).

In contrast, repeating these measurements in a low magnetic field of 0.2 kG yields high-visibility oscillations of the SiV$^-$ spin coherence (data 530 in FIG. 5A) suggesting a coherent coupling to several $^{13}$C nuclear spins in Sample 13. Coherent coupling to nuclear spins does not affect the $T_2$ time as measured by the spin-echo envelope (FIG. 5B showing spin echo $T_2$ at different fields for samples 13 and 12). The same $T_2$ times for Sample 13 is shown in magnetic fields from 0.2 kG to 1 kG and for Sample 12 in a 2 kG magnetic field. This demonstrates that coupling to nuclear spins is not the main factor which limits the SiV$^-$ spin $T_2$ time.

The observed scaling of the coherence time $T_2$ with number N of rephasing pulses (see FIG. 4C) is close to linear: $T_2 \propto N^\beta$, where $\beta=1.02\pm0.05$, according to some embodiments. This scaling contradicts dephasing due to a pure Lorentzian noise power spectrum which gives $T_2 \sim N^{2/3}$.

Figure 6:
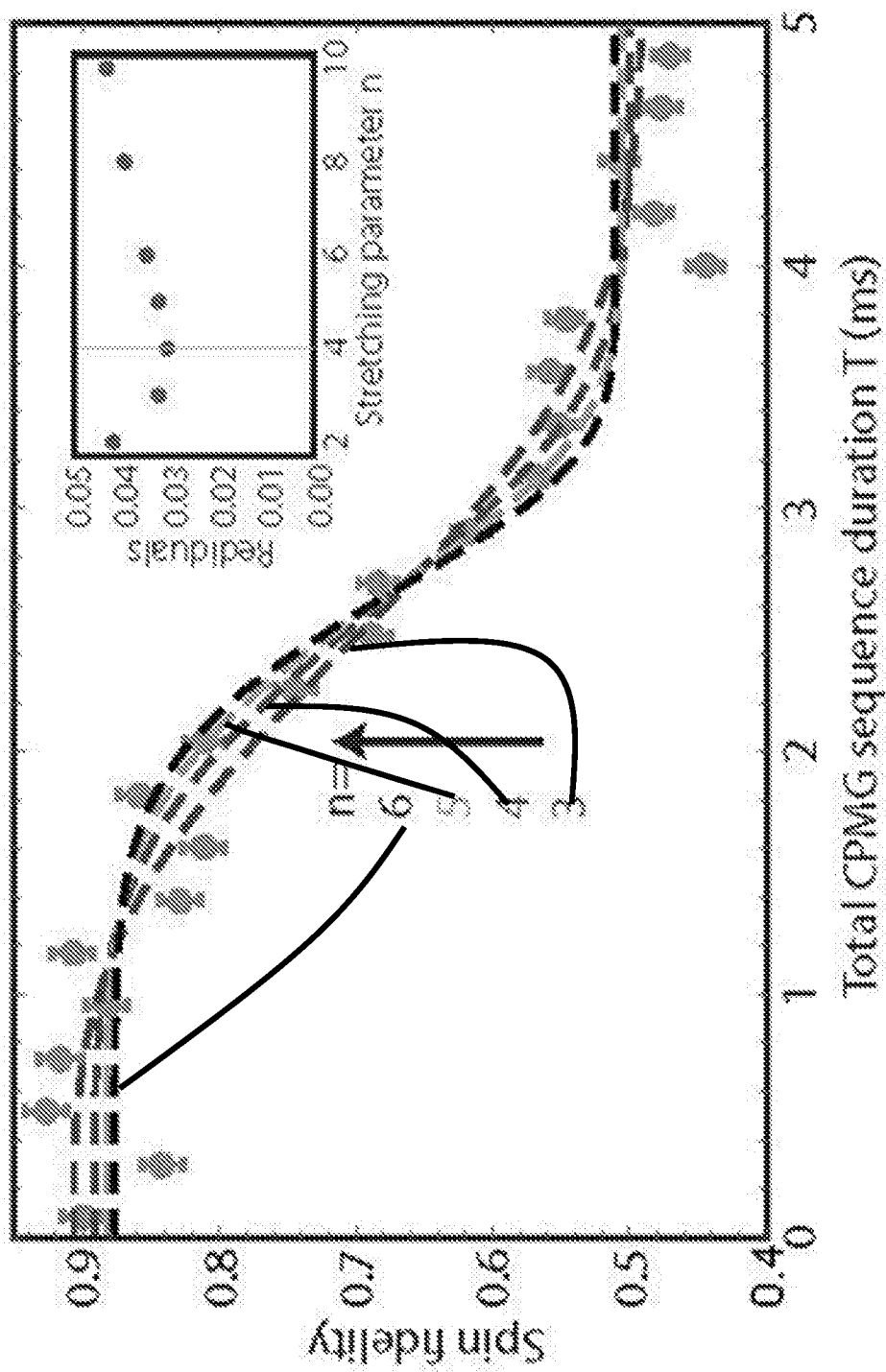
FIG. 6 shows experimental CPMG curves, according to some embodiments.

Different noise bath models can produce similar $T_2$ scaling but lead to different shapes of the CPMG curves. FIG. 6 shows the CPMG-8 (i.e, CPMG where N=8) curve (from FIG. 4B) fitted with different stretched exponentials exp $[-(T/T_0)^n]$. To fit the experimental data in FIG. 4B, a stretched exponential with n=4 is used since is gives the smallest fit residuals (see FIG. 9 inset). Using the present data, it is hard to distinguish between different noise models as it is hard to directly deconvolve the noise power spectrum.

Figures 7A, 7B:
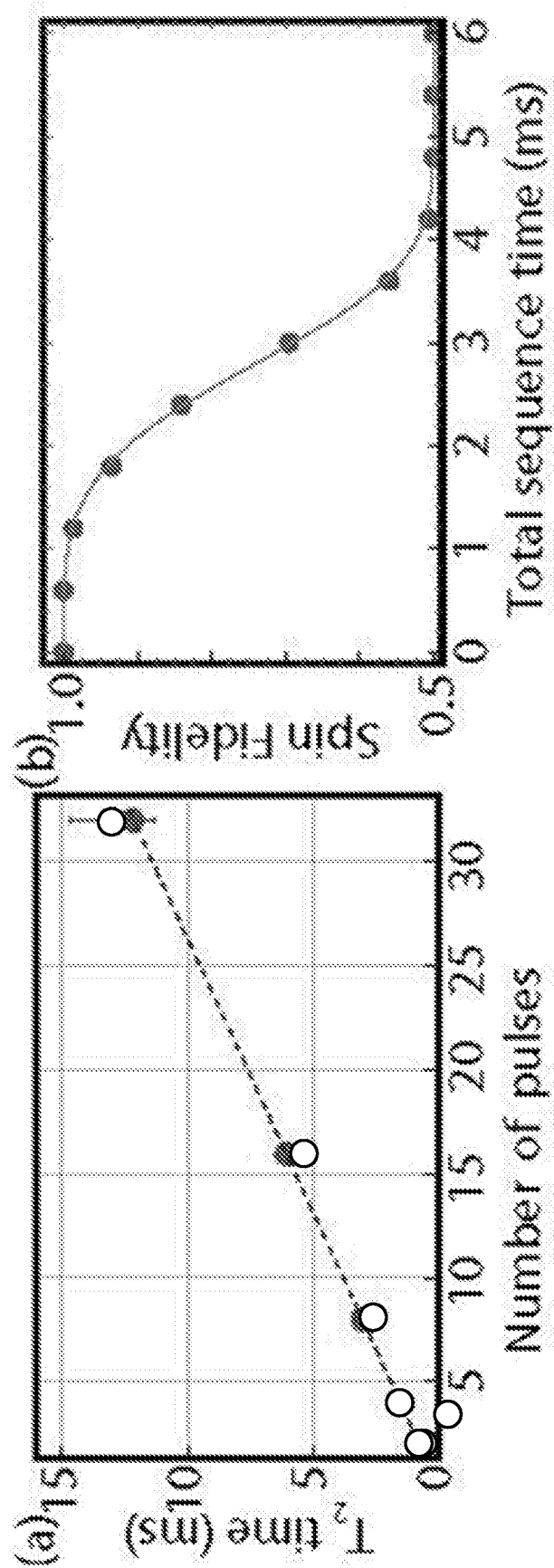
FIG. 7A-7B shows double-Gaussian noise power spectrum, according to some embodiments.

In FIG. 3F, the dependence of the $T_2^*$ time on the magnetic field amplitude is shown which indicates additional noise in the system. In contrast, there is no observed dependence of the $T_2$ time on magnetic field (FIG. 5B). This suggests a bimodal noise power spectrum: a slow-frequency component limits the $T_2^*$ time while a high-frequency component determines the $T_2$ time. For example, a double-Gaussian noise power spectrum: $S(\omega)=A\times\exp[-(\omega/\omega_0)^2]+B\times\exp[-(\omega/\omega_1)^2]$ where A $10^6$ s$^{-1}$, $\omega_0 \approx 1.8\cdot 10^3$ s$^{-1}$, B$\approx 10^9$ s$^{-1}$, and $\omega_1 \approx 50$ s$^{-1}$, provides a good agreement with the observed $T_2$ scaling (see FIG. 7A) and the correct order-of-magnitude for $T_2^* \approx 10$ µs. In this case, the calculated CPMG8 curve is close to a stretched exponential with n=4 9 (see FIG. 7B). FIG. 7A shows calculated $T_2$ times for CPMG sequences (dark points) and measured $T_2$ times (open points). The dashed line is a linear fit. The same result can be obtained using a double-Lorentzian noise power spectrum with hard frequency cutoffs. FIG. 7B shows the calculated CPMG8 curve (dots) fitted by a stretched exponential with n=4 (solid line).

According to some embodiments, the coherence time obtained using one or more of the above-mentioned methods or systems may be greater than 100 nanoseconds. According to some embodiments, the coherence time obtained using one or more of the above-mentioned methods or systems may be greater than 250 nanoseconds. According to some embodiments, the coherence time obtained using one or more of the above-mentioned methods or systems may be greater than 500 nanoseconds. According to some embodiments, the coherence time obtained using one or more of the above-mentioned methods or systems may be greater than 1 microsecond. According to some embodiments, the coherence time obtained using one or more of the above-mentioned methods or systems may be greater than 2 microseconds. According to some embodiments, the coherence time obtained using one or more of the above-mentioned methods or systems may be greater than 3 microseconds. According to some embodiments, the coherence time obtained using one or more of the above-mentioned methods or systems may be greater than 5 microseconds. According to some embodiments, the coherence time obtained using one or more of the above-mentioned methods or systems may be greater than 10 microseconds. According to some embodiments, the coherence time obtained using one or more of the above-mentioned methods or systems may be greater than 50 microseconds. According to some embodiments, the coherence time obtained using one or more of the above-mentioned methods or systems may be greater than 60 microseconds. According to some embodiments, the coherence time obtained using one or more of the above-mentioned methods or systems may be greater than 100 microseconds. According to some embodiments, the coherence time obtained using one or more of the above-mentioned methods or systems may be greater than 500 microseconds. According to some embodiments, the coherence time obtained using one or more of the above-mentioned methods or systems may be greater than 1 millisecond. According to some embodiments, the coherence time obtained using one or more of the above-mentioned methods or systems may be greater than 5 milliseconds. According to some embodiments, the coherence time obtained using one or more of the above-mentioned methods or systems may be greater than 10 milliseconds. According to some embodiments, the coherence time obtained using one or more of the above-mentioned methods or systems may be up to 13 millisecond or higher.

The invention claimed is:

1. A method of extending the coherence time in an electron spin qubit, comprising:
    providing at least one of electron spin qubit, the at least one electron spin qubit comprising an SiV spin having a qubit frequency;
    cooling the at least one electron spin qubit to a temperature less than or equal to 500 mK;
    controlling the electron spin qubit by applying microwaves at the qubit frequency, wherein the electron spin qubit is manipulatable at the qubit frequency to transition from a first spin state to a second spin state, and wherein the transition from a first spin state to the second spin state encodes information; and
    optically reading out the second spin state of the electron spin.

2. The method of claim 1, further comprising applying a magnetic field aligned along an axis of the at least one qubit.

3. The method of claim 2, further comprising aligning the magnetic field to increase the signal to noise ratio of the optically reading out the second spin state of the electron spin.

4. The method of claim 1, further comprising determining, prior to the coherently controlling the at least one electron spin qubit, the qubit frequency, wherein the qubit frequency is determined using pulsed optically-detected magnetic resonance.

5. The method of claim 1, wherein the spin coherence time is greater than 100 nanoseconds.

6. The method of claim 1, further comprising at least one dynamic decoupling step, wherein the dynamic decoupling step comprises providing at one Carr-Purcell-Meiboom-Gill (CPMG) pulse sequence comprising at least one n-pulse to the at least one electron spin qubit.

7. The method of claim 1, wherein at least one of the first spin state and the second spin state is a superposition of two spin states.

8. The method of claim 1, wherein the cooling further comprises cooling with a dilution refrigerator.

9. The method of claim 1, wherein the applying microwaves at the qubit frequency further comprises applying the microwaves using a coplanar waveguide patterned on a substrate containing the at least one electron spin qubit.

10. The method of claim 1, wherein the optically reading out the second spin state of the electron spin qubit comprises single-shot readout.

11. The method of claim 1, wherein the optically reading out the second spin state of the electron spin qubit comprises applying at least one laser pulse to the spin.

12. The method of claim 1, wherein the optically reading out the second spin state of the electron spin comprises reading out with an optical readout system, the optical readout system comprising an objective lens configured collect fluorescence light from the at least one electron spin qubit.

13. The method of claim 12, wherein the objective lens is moveable along at least one axis via at least one piezoelectric stage to perform at least one of focusing the optical readout system, positioning the optical readout system relative to the at least one electron spin qubit, and scan the objective lens to perform confocal imaging.

14. The method of claim 1, wherein the at least one electron spin qubit comprises a quantum register, and wherein the encoded information is a state of the register.

15. The method of claim 1, wherein the at least one electron spin qubit comprises a node in a quantum communications network, and wherein the encoded information is part of a communication on the quantum communications network.

16. A system comprising:
at least one electron spin qubit, the at least one electron spin qubit comprising a SiV spin having a qubit frequency, wherein the at least one electron spin qubit is optically addressable so that quantum information can be read out optically from the at least one electron spin qubit;
a cooling system for maintaining the at least one electron spin qubit at a temperature of 500 mK or less;
a magnetic field application structure alignable with the at least one electronic spin qubit;
a microwave frequency source, operable at the qubit frequency of the SiV centers, configured to manipulate at least one electron spin qubit at the qubit frequency to transition from a first spin state to a second spin state, wherein the second spin state comprises encoded information; and
an optical readout system configured to optically read out the second spin state.

17. The system of claim 16, wherein the spin coherence time of the at least one electron spin qubit is greater than 100 nanoseconds.

18. The system of claim 16, wherein the microwave frequency source comprises a coplanar waveguide patterned on a substrate containing the at least one electron spin qubit.

19. The system of claim 18, wherein the coplanar waveguide comprises a superconducting material.

20. The system of claim 19, wherein the microwave frequency source is further operable to apply at one Carr-Purcell-Meiboom-Gill (CPMG) pulse sequence comprising at least one n-pulse to the at least one electron spin qubit.

21. The system of claim 16, wherein at least one of the first spin state and the second spin state is a superposition of two spin states.

22. The system of claim 16, wherein the optical readout system comprises an objective lens configured collect fluorescence light from the at least one electron spin qubit.

23. The system of claim 22, wherein the objective lens is moveable along at least one axis via at least one piezoelectric stage to perform at least one of focusing the optical readout system, positioning the optical readout system relative to the at least one electron spin qubit, and scan the objective lens to perform confocal imaging.

24. The system of claim 16, wherein the optical readout system is configured to readout the second spin state of the at least one electron spin qubit using single-shot readout.

25. The system of claim 16, wherein the optical readout system further comprises at least one laser source configured to apply at least one laser pulse to the at least one electron spin qubit.

26. The system of claim 16, wherein the at least one electron spin qubit comprises a quantum register, and wherein the encoded information is a state of the register.

27. The system of claim 16, wherein the at least one electron spin qubit comprises a node in a quantum communications network, and wherein the encoded information is part of a communication on the quantum communications network.

* * * * *